United States Patent
Bae et al.

(10) Patent No.: US 8,243,542 B2
(45) Date of Patent: *Aug. 14, 2012

(54) RESISTANCE VARIABLE MEMORY DEVICES AND READ METHODS THEREOF

(75) Inventors: Junsoo Bae, Hwseong-si (KR); Dueung Kim, Yongin-si (KR); Kwangjin Lee, Hwaseong-si (KR); Hyungrok Oh, Yongin-si (KR); Beakhyung Cho, Hwaseong-si (KR); Byunggil Choi, Yongin-si (KR); Woo-Yeong Cho, Suwon-si (KR); Yu-Hwan Ro, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 261 days.

This patent is subject to a terminal disclaimer.

(21) Appl. No.: 12/691,769

(22) Filed: Jan. 22, 2010

(65) Prior Publication Data

US 2010/0118595 A1    May 13, 2010

Related U.S. Application Data

(63) Continuation-in-part of application No. 12/124,523, filed on May 21, 2008, now Pat. No. 7,668,007, and a continuation-in-part of application No. 11/605,212, filed on Nov. 29, 2006, now Pat. No. 7,391,644.

(30) Foreign Application Priority Data

Nov. 30, 2005  (KR) ................................ 2005-115629
Dec. 21, 2005  (KR) ................................ 2005-127038

(51) Int. Cl.
    *G11C 7/00*    (2006.01)

(52) U.S. Cl. ......................................... 365/203; 365/163
(58) Field of Classification Search .................. 365/203, 365/163, 189.09
See application file for complete search history.

(56) References Cited

U.S. PATENT DOCUMENTS

| 6,504,761 | B2 | 1/2003 | Kai et al. | |
|---|---|---|---|---|
| 6,567,296 | B1 | 5/2003 | Casagrande et al. | |
| 6,667,900 | B2 | 12/2003 | Lowrey et al. | |
| 6,707,712 | B2 * | 3/2004 | Lowery | 365/175 |
| 7,391,644 | B2 * | 6/2008 | Cho et al. | 365/163 |
| 7,668,007 | B2 * | 2/2010 | Choi et al. | 365/163 |
| 2003/0026134 | A1 | 2/2003 | Lowrey | |
| 2005/0030814 | A1 * | 2/2005 | Oh et al. | 365/222 |
| 2005/0128799 | A1 | 6/2005 | Kurotsuchi et al. | |
| 2007/0103972 | A1 * | 5/2007 | Ro et al. | 365/163 |

FOREIGN PATENT DOCUMENTS

| JP | 2002-124085 | 4/2002 |
|---|---|---|
| JP | 2002-237193 | 8/2002 |
| JP | 2005-514722 | 5/2005 |

(Continued)

*Primary Examiner* — Vu Le
(74) *Attorney, Agent, or Firm* — Volentine & Whitt, PLLC

(57) ABSTRACT

A resistance-variable memory device includes memory cells, a high voltage circuit, a precharging circuit, a bias circuit, and a sense amplifier. Each memory cell may, for example, include a resistance-variable material and a diode connected to a bitline. The high voltage circuit provides a high voltage from a power source. The precharging circuit raises the bitline up to the high voltage after charging the bitline up to the power source voltage. The bias circuit supplies a read current to the bitline using the high voltage. The sense amplifier compares a voltage of the bitline with a reference voltage by means of the high voltage.

20 Claims, 34 Drawing Sheets

FOREIGN PATENT DOCUMENTS

| | | |
|---|---|---|
| JP | 2005-166210 | 6/2005 |
| KR | 100172380 B1 | 10/1998 |
| KR | 1020010078352 A | 8/2001 |
| KR | 1020020066941 A | 8/2002 |
| KR | 1020030069652 A | 8/2003 |
| KR | 1020040050534 | 6/2004 |
| KR | 1020050029013 A | 3/2005 |
| KR | 1020050054851 A | 6/2005 |
| WO | WO 03/058632 A1 | 7/2003 |

* cited by examiner

RESISTANCE VARIABLE MEMORY DEVICES AND READ METHODS THEREOF

CROSS-REFERENCE TO RELATED APPLICATIONS

This is a continuation-in-part (CIP) of U.S. patent application Ser. No. 12/124,523, filed May 21, 2008, which is a continuation-in-part (CIP) of U.S. patent application Ser. No. 11/605,212, filed Nov. 29, 2006, and issued as U.S. Pat. No. 7,391,644 on Jun. 24, 2008. The disclosures of both prior applications are incorporated herein by reference in their entirety.

In addition, a claim of priority under 35 U.S.C. §119 is made to Korean Patent Application 2005-115629, filed Nov. 30, 2005, and to Korean Patent Application 2005-127038, filed Dec. 21, 2005, the entire contents of which are hereby incorporated by reference.

BACKGROUND

The subject matter disclosed herein is concerned with semiconductor memory devices. In particular, the subject matter disclosed herein relates to memory devices that utilize resistance-variable materials, and to methods of reading data using such memory devices.

Semiconductor memories are devices capable of selectively storing and recalling data. Semiconductor memory devices are roughly classified as either random access memories (RAMs) or read-only memories (ROMs). RAMs are a class of memory that includes dynamic RAMs (DRAMs) and static RAMs (SRAMs). ROMs are a class of memories that include programmable ROMs (PROMs), erasable PROMs (EPROMs), electrically EPROMs, and flash memory devices.

A particular form of programmable ROM that has been growing in popularity is known as "resistance-variable" RAMs (or "PRAMs), which are memory devices that use chalcogenide alloys to store data. One reason for the popularity of PRAMs is that they can be fabricated by simple manufacturing processes relative to other resistance-variable devices, which gives PRAMs an advantage in providing large-capacity storage devices at low cost.

FIG. 1 is an equivalent circuit diagram showing a unit cell of a resistance-variable memory device. Referring to FIG. 1, the unit cell 10 includes a memory element 11 and a selection element 12. The memory element 11 is connected between a bitline BL and the selection element 12. The selection element 12 is connected between the memory element 11 and a ground.

The memory element 11 contains a phage-changeable material, such as Ge—Sb—Te (GST), that can vary in resistance based on its physical state. The physical state of a phage-changeable material can take either a generally crystalline or generally amorphous state, and for the present example the state of the resistance-variable material (GST) (and thus its resistance) can be controlled based on a current supplied through the bitline BL.

The selection element 12 of the unit cell 10 is an NMOS transistor NT. Note that the gate of the NMOS transistor NT is coupled to a wordline WL. When a predetermined voltage is applied to the wordline WL, the NMOS transistor NT is turned on to supply a current to the memory element 11 through the bitline BL. While in FIG. 1 the memory element 11 is connected between the bitline BL and the selection element 12, the selection element 12 may instead be connected between the bitline BL and the memory element 11.

FIG. 2 is an equivalent circuit diagram showing another unit cell 20 of a resistance-variable memory device. Referring to FIG. 2, the unit cell 20 includes a memory element 21 and a selection element 22 with the memory element 21 connected between a bitline BL and the selection element 22. The memory element 21 is the same as the memory element 11 shown in FIG. 1. The selection element 22 is composed of a diode D.

In operation, when a voltage difference between the anode and cathode of the selection element 22 (diode D) becomes higher than the diode's threshold, the selection element 22 is turned on to supply a current to the memory element 21 through the bitline BL. Accordingly, the resistance of the memory element 21 can be measured during read operations, and heat can be applied during write operations.

FIG. 3 is a graph showing the operational characteristics of the GST resistance-variable material used in the unit cells 10 and 20 shown FIGS. 1 and 2. Referring to FIG. 3, the reference numeral 1 denotes a characteristic curve representing a change of the GST resistance-variable material to an amorphous state, while the reference numeral 2 denotes a characteristic curve representing a change of the GST resistance-variable material to a crystalline state.

Referring to reference curve 1, the GST resistance-variable material can tranform to its amorphous state by heating the GST resistance-variable material to a temperature higher than its melting point Tm using a controlled current for a time T1 and then quenching the temperature. The amorphous state, also known as the 'reset state', is used to store a data '1' within the GST resistance-variable material.

Referring next to reference curve 2, the GST resistance-variable material can transform to its crystalline state by heating it up to a temperature higher than its crystallization temperature Tc and lower than the melting temperature Tm using a controlled current for a time T2 (typically longer than T1) and then cooling the GST resistance-variable material relatively slowly. The crystalline state is called the 'set state' and is used for storing a data '0'. The resistance of the GST resistance-variable material is higher in the amorphous state than in the crystalline state.

A normal resistance-variable memory device having a plurality of memory cells can accept an external power source voltage VCC to precharge its bitlines BL and/or supply read current to the bitline BL. For read operations, a phage-changeable memory device generally employs a precharging circuit, a bias circuit, and a sense amplifier. The precharging circuit preliminarily charges the bitline BL up to the power source voltage VCC. The bias circuit supplies the read current to the bitline BL from the power source voltage VCC. The sense amplifier compares a voltage of a sensing node with a reference voltage, and reads data from the memory cell.

However, during a read operation, a "sensing margin" of the sense amplifier can inadvertently be reduced or the power source voltage VCC can decrease below a predetermined voltage level (e.g., 1.5V). The sensing margin is the voltage difference between the reset and set states at the sensing node of a memory cell. For embodiments where the selection element uses an NMOS transistor (e.g., memory cell 10 of FIG. 1) and the power source voltage VCC is 1.5V, the sensing node is maintained at about 1.5V if the memory cell is configured in the reset state. However, the sensing node will be reduced from the power source voltage VCC to the ground level if the memory cell is configured in the set state.

On the other hand, in the case where a selection element of a memory cell is formed from a diode (e.g., memory cell 20 of FIG. 2), the sensing node will be maintained at about 1.5V when the memory cell 20 is maintained in the reset state, but the sensing node will be reduced to the threshold voltage of the diode when the memory cell is configured to the set state. For this reason, the sensing margin of a resistance-variable memory device employing a diode D as a selection element is reduced by the threshold voltage of the diode D. The sensing margin is further reduced when the threshold voltage of the diode D rises due to factors arising from the diode's fabrication process.

SUMMARY

The inventive concepts are generally directed to the utilization of a voltage pump to improve sensing margins in a resistance-variable memory device.

In an illustrative embodiment, a resistance-variable memory device includes a memory cell connected to a bitline, a high voltage circuit adapted to generate a high voltage from a power source voltage, a precharging circuit adapted to charge the bitline to the power source voltage and further charge the bitline to the high voltage, a bias circuit adapted to provide a read current to the bitline using the high voltage, and a sense amplifier adapted to detect a voltage level of the bitline using the high voltage.

In another illustrative embodiment, a method of reading data in a resistance-variable memory device includes discharging a bitline that is connected to a memory cell, charging the bitline using a power source voltage, charging the bitline using a high voltage after charging the bitline using the power source voltage, providing a read current to the bitline using the high voltage, and sensing a voltage of the bitline using the high voltage and reading data from the memory cell.

In yet another illustrative embodiment, a resistance-variable memory device includes a memory cell connected to a bitline, a precharging circuit charging the bitline to a precharging voltage, a bias circuit providing a read current to the bitline using a high voltage which is larger than the precharging voltage, a sense amplifier detecting a voltage level of the bitline using the high voltage, and a high voltage circuit generating one of the precharging and high voltages from a power source voltage.

In still yet another illustrative embodiment, a method of reading data in a resistance-variable memory device includes discharging a bitline connected to a memory cell, precharging the bitline to a precharging voltage, providing a read current to the bitline using a high voltage which is larger than the precharging voltage, and sensing a voltage level of the bitline using the high voltage and reading data from the memory cell.

BRIEF DESCRIPTION OF THE FIGURES

Non-limiting embodiments of the inventive concepts will be described with reference to the following figures, wherein like reference numerals refer to like parts throughout the various figures unless otherwise specified. In the figures.

DETAILED DESCRIPTION OF EMBODIMENTS

Preferred embodiments of the inventive concepts will be described below in more detail with reference to the accompanying drawings. The inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

Figure 4:
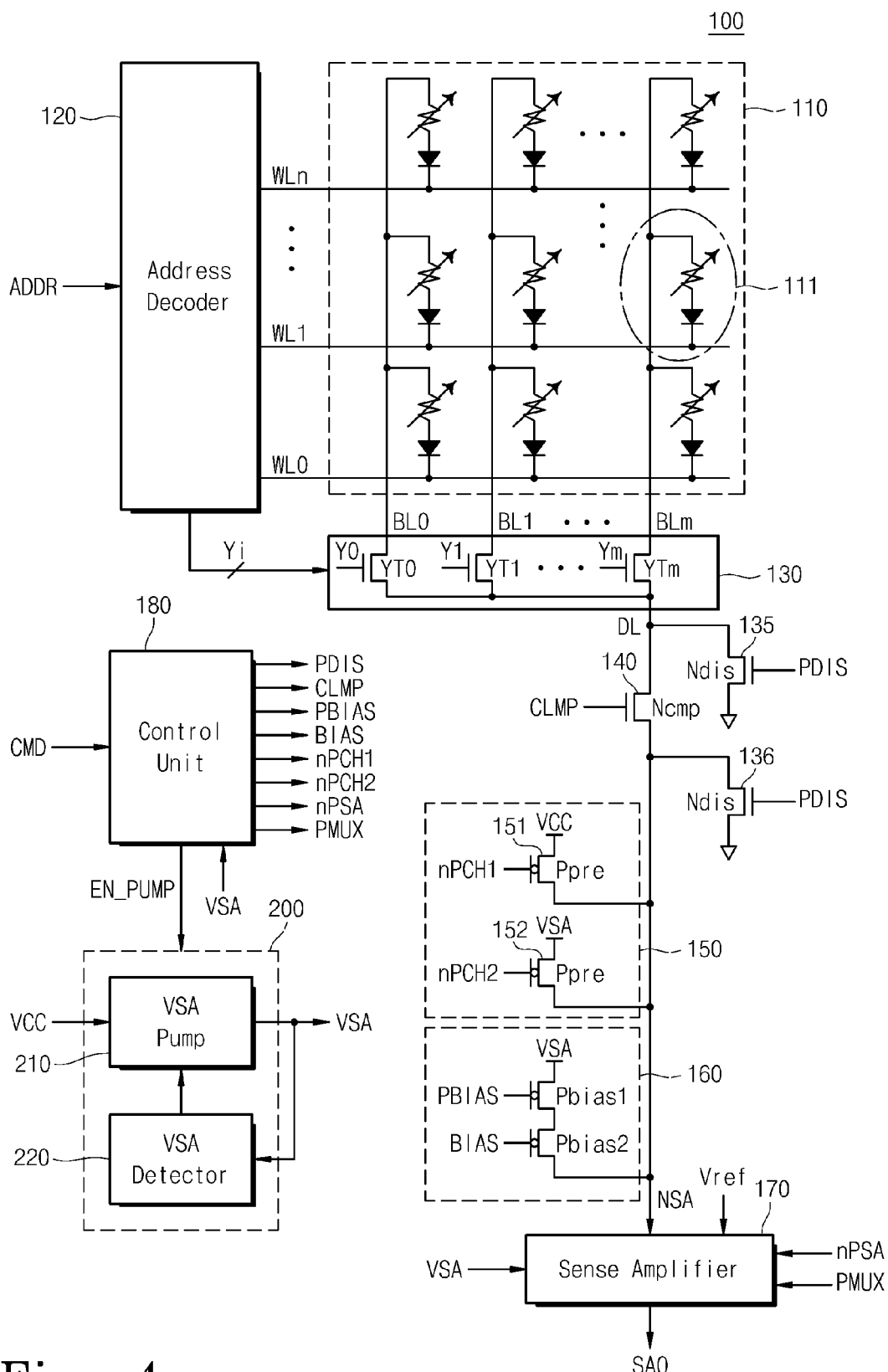
FIG. 4 is a block diagram illustrating structural features of a resistance-variable memory device in accordance with an illustrative embodiment of the inventive concepts.

FIG. 4 is a block diagram illustrating structural features of a resistance-variable memory device in accordance with an illustrative embodiment of the inventive concepts. As shown in the example of FIG. 4, the resistance-variable memory device 100 includes a memory cell array 110, an address decoder 120, a bitline selection circuit 130, discharge circuits 135 and 136, a clamping circuit 140, a precharging circuit 150, a bias circuit 160, a sense amplifier 170, a control unit 180 and a high voltage circuit 200.

The memory cell array 110 is composed of plural memory cells. The plural memory cells are coupled with pluralities of wordlines WL0~WLn and bitlines BL0~BLm. Each memory cell can be formed of a memory element and a selection element. Each memory element includes a GST resistance-variable material and each selection element is made up of a diode.

Note, however, that in other embodiments one can employ a transistor as the selection element instead of a diode. In operation, the resistance-variable memory device 100 operates to supply a reset or set current to a selected memory cell in order to program the memory cell in the reset or set state. Note that the reset current is larger than the set current. Accordingly, when a transistor is used as the selection element, it is useful for the transistor to have a threshold voltage lower than that of a MOS transistor of the sense amplifier 170 used to program the memory cell.

The address decoder 120 operates to decode an address ADDR input from the external to select the wordlines and bitlines. The address ADDR is differentiated into a row address RA for selecting the wordlines WL0~WLn and a column address CA for selecting the bitlines BL0~BLm.

For example, in FIG. 4, wordline WL1 and the bitline BLm are designated respectively among the plural wordlines WL0~WLn and the bitlines BL0~BLm. By designating wordline WL1 and bitline BLm, memory cell 111 can be selected in the memory cell array 110.

The bitline selection circuit 130 selects a bitline in response to a selection signal Yi (i=0~m) provided from the address decoder 120. The bitline selection circuit 130 includes pluralities of NMOS transistors YT0~YTm. The plural NMOS transistors YT0~YTm respectively connect the bitlines BL0~BLm with a data line DL. For instance, when the selection signal Ym is activated, bitline BLm is be electrically connected to the data line DL.

The first discharge circuit 135 is connected between the data line DL and the ground terminal and is configured to discharge the data line DL. The second discharge circuit 136 is connected between a sensing node NSA and the ground terminal and is configured of discharge the sensing node NSA. Referring to FIG. 4, the first discharge circuit 135 is composed of an NMOS transistor Ndis forming a current path between the data line DL and the ground terminal, and in operation discharges the data line DL in response to a discharge signal PDIS, which is provided from the control unit 180. Likewise, the second discharge circuit 136 is composed of an NMOS transistor Ndis forming a current path between the sensing node NSA and the ground terminal, and in operation discharges the sensing node NSA in response to the discharge signal PDIS.

The clamping circuit 140 regulates the data line DL under a predetermined voltage level during a read operation. The purpose of this clamping operation is to restrict a voltage of the selected bitline BLm to not exceed a threshold voltage of the resistance-variable material. In other words, the voltage across the resistance-variable material is controlled so as not to be higher than the threshold voltage. For instance, assuming that the diode and the resistance-variable material are designed with threshold voltages of 0.5V and 1V respectively, the selected bitline BLm may be regulated to a voltage less than 1.5V, i.e., at about 1V.

Referring still to FIG. 4, the clamping circuit 140 may be composed of an NMOS transistor Ncmp forming a current path between the sensing node NSA and the data line DL, and serves to restrict the voltage level of the data line DL in response to a clamp signal CLMP, which is provided from the control unit 180. For example, assuming that a threshold voltage of the NMOS transistor Ncmp is 1V and the clamp signal CLMP is set on 2V, the data line DL may be clamped to a maximum of about 1V. Simultaneously, the selected bitline BLm also may be similarly regulated. The clamp signal CLMP may have a constant DC voltage level during read operations.

The precharging circuit 150 charges the sensing node NSA to the voltage level of the power source voltage VCC and then raises the sensing node NSA up to the level of a high voltage VSA. During this process, the selected bitline BLm may be precharged to the clamping voltage (e.g., 1V). As shown in FIG. 4, the precharging circuit 150 may include first and second precharging circuits 151 and 152. The first precharging circuit 151 initially charges the sensing node NSA up to the power source voltage VCC in response to a first precharging signal nPCH1, while the second precharging circuit 152 initially charges the sensing node NSA up to the high voltage VSA in response to a second precharging signal nPCH2. The first and second precharging signals nPCH1 and nPCH2 are provided from the control unit 180.

The first precharging circuit 151 is connected between a first power terminal and the sensing node NSA. In operation, the first precharging circuit 151 receives the power source voltage VCC through the first power terminal, and precharges the sensing node NSA up to the power source voltage VCC in response to the first precharging signal nPCH1. As shown in FIG. 4, the first precharging circuit 151 is composed of a PMOS transistor Ppre. The PMOS transistor Ppre of the first precharging circuit 151 is configured such that its gate receives the first precharging signal nPCH1, its source is connected to the power source voltage VCC and its drain is connected to the sensing node NSA. While not explicitly shown in FIG. 4, the bulk of the PMOS transistor Ppre is boosted by the high voltage VSA.

The second precharging circuit 152 is connected between a second power terminal and the sensing node NSA, and is configured to receive the high voltage VSA through the second power terminal, and precharge the sensing node NSA up to the high voltage VSA in response to the second precharging signal nPCH2. As shown in FIG. 4, the second precharging circuit 152 is composed of a PMOS transistor Ppre much like the first precharging circuit 151. The PMOS transistor Ppre of the second precharging circuit 152 is configured such that its gate receives the second precharging signal nPCH2, its source is connected to the high voltage VSA, its drain is connected to the sensing node NSA, and its bulk is boosted by the high voltage VSA.

If the precharging circuit 150 is designed to operate only with the high voltage VSA, the high voltage circuit 200 may have an excessive capacitive burden when having to precharge an excessive number of bitlines during a burst read operation. Further, during a precharging operation, the high voltage circuit 200 may have to bear an excessively large precharging burden because each bitline may have a large capacitance.

In order to lower the burden on the high voltage circuit 200 while precharging the bitlines, the precharging circuit 150 can conduct the precharging operation in two sequential steps. In the first precharging step, the selected bitline BLm can be charged up to the level of the power source voltage VCC. During this step, the first precharging circuit 151 performs the precharging operation using the externally supplied power source voltage VCC. In the second precharging step, the voltage of the selected bitline BLm can further rise up to the level of the high voltage VSA. During this step, the second precharging circuit 152 performs the precharging operation with the high voltage VSA that is provided from the high voltage circuit 200.

As was previously mentioned, the precharging circuit 150 boosts the sensing node NSA up to the high voltage VSA from the power source voltage VCC during the second precharging step. Note that it can be advantageous that the high voltage circuit 200 supplies the high voltage VSA to the precharging circuit 150 only during the second precharging step. That is, the resistance-variable memory device 100 can benefit from a reduction of the capacitive burden of the high voltage circuit 200 during the precharging operation while offering a sufficient sensing margin to the sense amplifier 170 during a sensing operation. This will be described later in further detail with reference to FIG. 5.

In the example of this embodiment, the bias circuit 160 is connected between a power terminal of the high voltage VSA and the sensing node NSA and supplies a read current to the selected bitline BLm. As shown in FIG. 4, the bias circuit 160 is composed of two PMOS transistors Pbias1 and Pbias2, and receives the high voltage VSA through the power terminal.

The first PMOS transistor Pbias1 is connected between the power terminal and the second PMOS transistor Pbias2, and is controlled by a first biasing signal PBIAS. The second PMOS transistor Pbias2 is connected between the first PMOS transistor Pbias1 and the sensing node NSA, and is controlled by a second biasing signal BIAS. The second biasing signal BIAS is supplied from the control unit 180 and is set to a predetermined DC voltage level during the read operation. In this example, the bias circuit 160 supplies a read current to the selected bitline BLm when the first biasing signal PBIAS is set on low voltage level.

The sense amplifier 170 compares a voltage of the sensing node NSA with a reference voltage Vref during the read operation to produce output a sensing result SAO. The reference voltage Vref may be supplied from a reference voltage generator (not shown). The sense amplifier 170 conducts its sensing operation using the high voltage VSA. During the sensing operation, the sense amplifier 170 receives control signals nPSA and PMUX from the control unit 180. Note that the structure and operation of the sense amplifier 170 will be described in further detail with reference to FIGS. 6 and 7.

The control unit 180, which may be a logic circuit and/or microprocessor circuit, outputs control signals PDIS, CLMP, PBIAS, BIAS, nPCH1, nPCH2, nPSA, PMUX, and EU_PUMP in response to a command CMD provided from an external source. The pumping enable signal EN_PUMP is applied to the high voltage circuit 200. Operational features of the control signals output from the control unit 180 will be described in further detail with reference to FIGS. 5 and 7.

The high voltage circuit 200 includes a voltage pump 210 and a detector 220. In operation, the voltage pump 210 boosts the level of the power source voltage VCC by way of a charge pumping mechanism. The detector 220 is a circuit which senses whether the output voltage of the voltage pump 210 has reached the level of the high voltage VSA. When the output voltage of the voltage pump 210 reaches the high voltage VSA, the detector 220 disables the voltage pump 210. In contrast, unless the output voltage of the voltage pump 210 has reached the high voltage VSA, the detector 220 continues to enable the voltage pump 210 to boost the power source voltage VCC. Note that the high voltage VSA is supplied to the precharging circuit 150, the bias circuit 160 and the sense amplifier 170.

Figure 5:
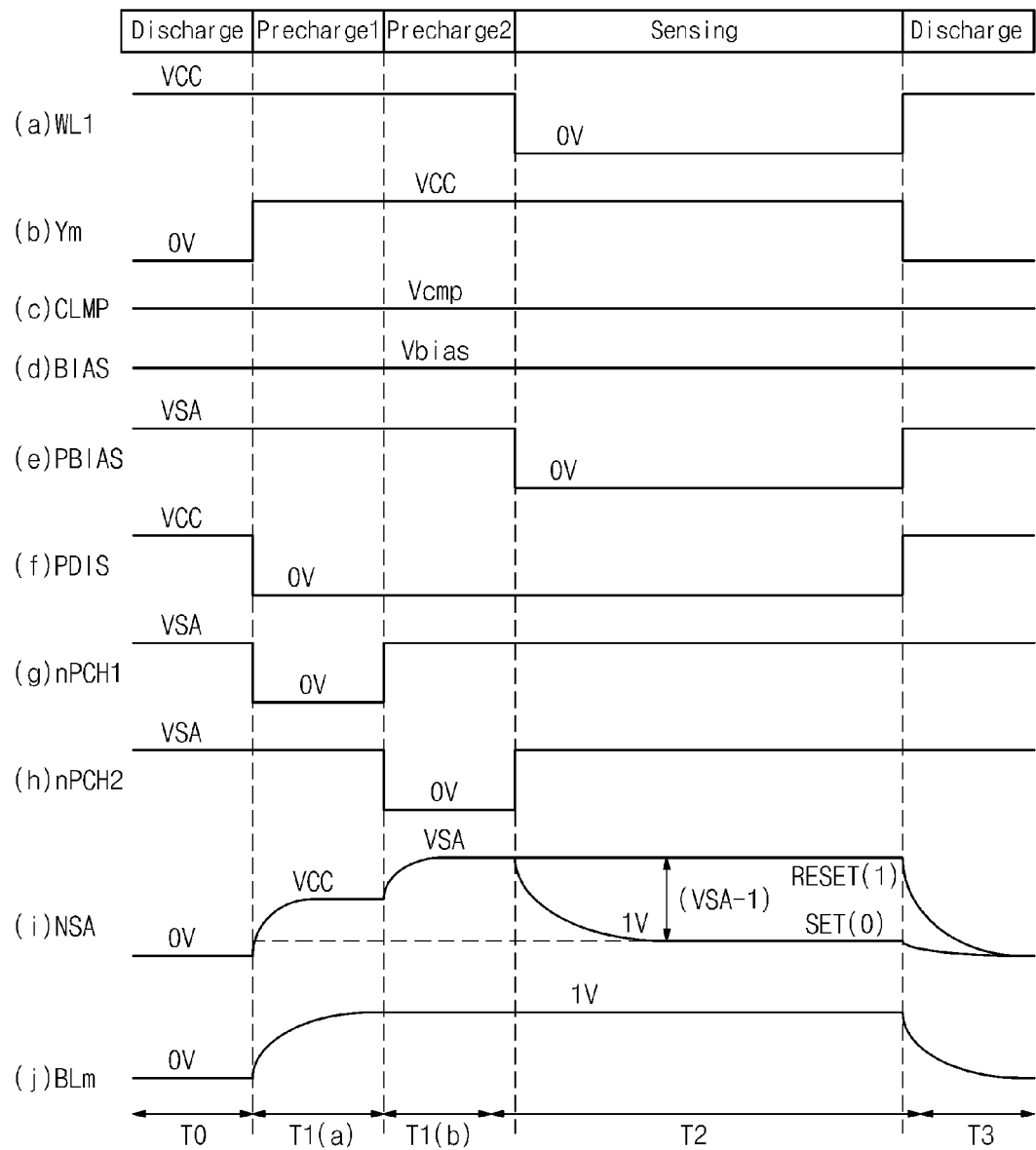
FIG. 5 is a timing diagram for use in explaining an operation of the resistance-variable memory device shown in FIG. 4.

FIG. 5 is a timing diagram for use in explaining an operation of the resistance-variable memory device 100 shown in FIG. 4. As shown in FIG. 5, the operation is described with regard to a read operation having sequential periods of discharging T0, first precharging T1($a$), second precharging T1($b$), sensing T2, and discharging T3. For convenience of description, the read operation is carried out for the memory cell 111 of FIG. 4 as an example.

In the discharging period T0, the data line NSA and the sensing node NSA are discharged to the ground voltage level. As shown in FIG. 5, as the selection signal Ym is maintained at a low level, the selected bitline BLm is electrically disconnected from the data line DL. Further, as the discharge signal PDIS is set to a high level, the data line DL and the sensing node NSA are discharged to the ground voltage level. As the first biasing signal PBIAS is set to a high level, the first PMOS transistor Pbias1 of the bias circuit 160 are turned off. One purpose of holding the selected bitline BLm to the ground level is to prevent the bitline BLm from being discharged by a bitline discharging circuit (not shown) disposed on the bitline BLm.

In the first precharging period T1($a$), the sensing node NSA is precharged to the power source voltage VCC and the selected bitline BLm rises up to the clamping voltage (e.g., 1V). Further, the selection signal Ym rises to a high level while the discharge signal PDIS sinks to a low level. The first precharging signal nPCH1 also sinks to low level. When the selection signal Ym rises to a high level, the bitline BLm is electrically connected with the data line DL. When the discharge signal PDIS sinks to a low level, the NMOS transistors Ndis of the discharging circuits 135 and 136 are turned off. When the first precharging signal nPCH1 sinks to a low level, the sensing node NSA is precharged to the power source voltage VCC. If the sensing node NSA is charged up to the power source voltage VCC, the voltage of the selected bitline BLm rises up toward the clamping voltage 1V.

In the second precharging period T1($b$), the second precharging signal nPCH2 sinks to a low level. Responding to this low level of the second precharging signal nPCH2, the sensing node NSA is further charged to the high voltage VSA. If the sensing node NSA is charged up to the high voltage VSA, the selected bitline BLm will rise to the clamping voltage 1V.

In the sensing period T2, the selected wordline WL1 is set to a low voltage level. When the wordline WL1 becomes low level, a voltage level of the sensing node NSA is variably dependent on the state of the memory cell 111. During the sensing period T2, the first bias signal PBIAS is reduced to a low level. From the transition of the first bias signal PBIAS to this low level, a read current flows into the selected memory cell 111 through the bias circuit 160.

If the selected memory cell 111 is conditioned in the reset state, i.e., storing data '1', the sensing node NSA can retain the high voltage VSA. Note that the sensing node NSA is able to retain the high voltage VSA because the read current is being supplied via the bias circuit 160.

If the selected memory cell 111 is conditioned in the set state, i.e., storing data '0', the voltage level of the sensing node NSA will fall down toward 1V from the high voltage VSA. During this time, the voltage level of the sensing node NSA will not go to the ground level GND but instead to 1V due to the threshold voltage of the diode. During period T2, the sense amplifier 170 is activated to conduct its sensing operation. The sensing operation by the sense amplifier 170 will be further described later with reference to FIGS. 6 and 7.

In the discharging period T3, the selected wordline WL1 is set to a high level. The selection signal Ym sinks to a low level while the discharge signal PDIS rises to a high level. Responding to the low level of the selection signal, the selected bitline BLm is electrically disconnected with the data line DL. Responding to the high level of the discharge signal PDIS, the sensing node NSA is discharged to the ground level.

In the case of the conventional resistance-variable memory device, a sensing margin of the sensing node NSA is no more than VCC−1V. Thus, if the power source voltage VCC is lowered under 1.5V, the sensing margin is reduced to less than 0.5V. This drop of sensing margin acts to heavily degrade a read operation performance. However, as shown in FIG. 5, the resistance-variable memory device has of the present embodiment has an increased sensing margin at the sensing node NSA, i.e., the sensing margin is VSA−1V, where VSA>VCC.

Moreover, according to the resistance-variable memory device 100 of the example of this embodiment, since the precharging operation is carried out through two steps with using the power source voltage VCC and the high voltage VSA, the capacitive burden of the high voltage circuit 200 during the precharging operation is lessened.

Figure 6:
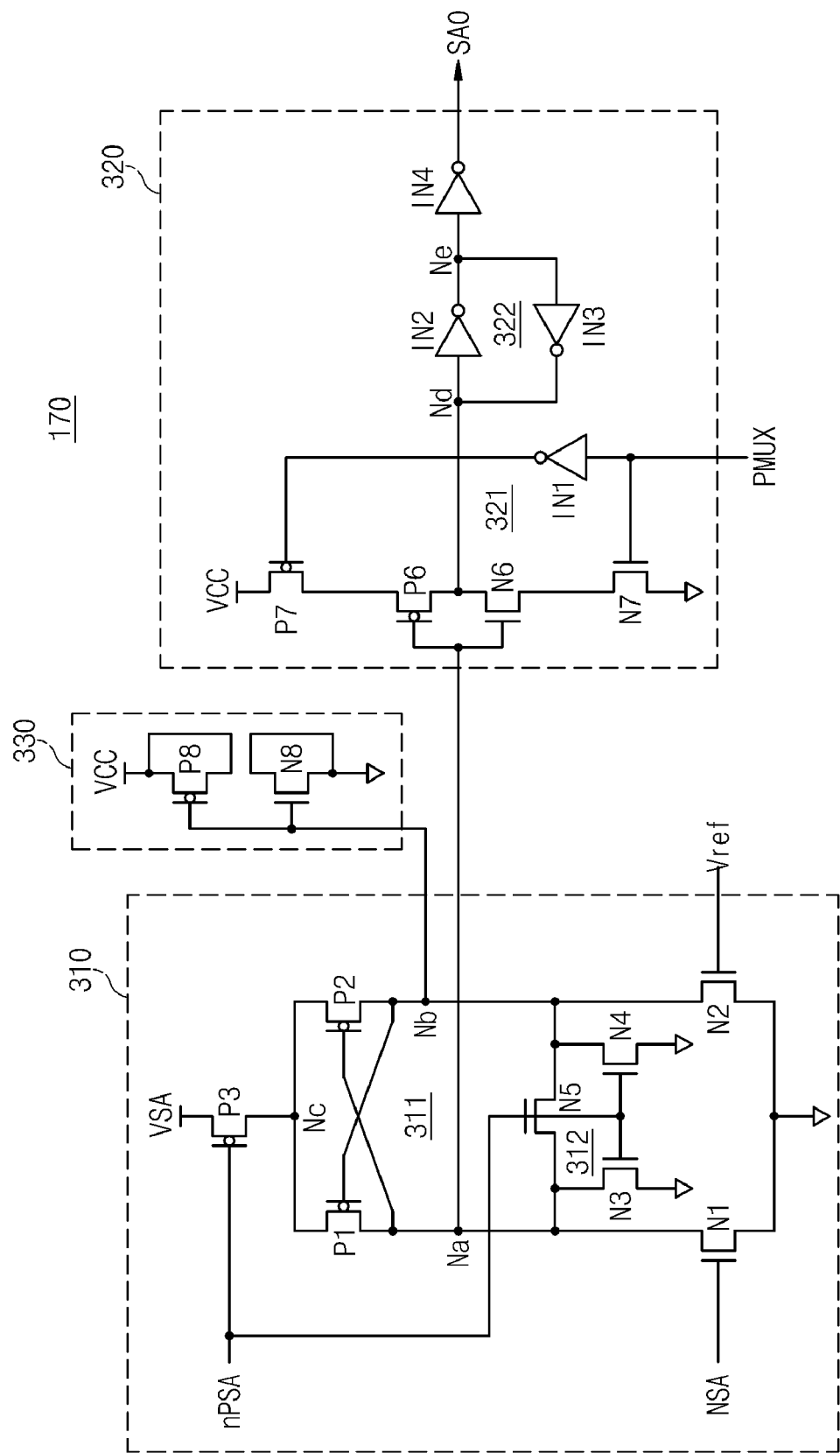
FIG. 6 is a circuit diagram illustrating the sense amplifier shown in FIG. 5.

FIG. 6 is a circuit diagram illustrating an example of the sense amplifier shown in FIG. 5. The sense amplifier 170 outputs the sensing result SAO based on a comparison of a voltage of the sensing node NSA and the reference voltage Vref. The sense amplifier 170, which receives the high voltage VSA, conducts the sensing operation in response to the control signals nPSA and PMUX. As shown in FIG. 6, the sense amplifier 170 includes a sensing circuit 310, a latch circuit 320 and a dummy latch circuit 330.

The sensing circuit 310 includes a plurality of PMOS transistors P16~P3 and a plurality of NMOS transistors N1~N5. The sensing circuit 310 is composed of a differential amplifier 311 and an equalizer 312. In operation, the differential amplifier 311, which uses the high voltage VSA, is configured to sense and amplify the difference between the reference voltage Vref and a voltage of the sensing node NSA. The equalizer 312 forces output nodes Na and Nb of the differential amplifier to be equal to each other in voltage level.

The differential amplifier 311 is composed of first and second NMOS transistors N1 and N2, and first, second and third PMOS transistors P1, P2, and P3. The first NMOS transistor N1 forms a current path between the first node Na and the ground in response to a voltage of the sensing node NSA. The second NMOS transistor N2 forms a current path between the second node Nb and the ground in response to the reference voltage Vref. The first PMOS transistor P1 forms a current path between the third node Nc and the first node Na in response to a voltage of the second node Nb. The second PMOS transistor P2 forms a current path between the third node Nc and the second node Nb in response to a voltage of the first node Na. The third PMOS transistor P3 forms a current path between the power terminal of VSA and the third node Nc in response to the control signal nPSA. The third PMOS transistor P3 receives the high voltage VSA through the power terminal.

The equalizer 312 is composed of third, fourth and fifth NMOS transistors N3, N4, and N5. The third NMOS transistor N3 is connected between the first node Na and the ground. The fourth NMOS transistor N4 is connected between the second node Nb and the ground. The fifth NMOS transistor N5 is connected between the first node Na and the second node Nb. The third through fifth NMOS transistors N3-N5 are simultaneously turned on or off in response to the control signal nPSA.

The latch circuit 320, which is connected to the first node Na of the sensing circuit 310, outputs the sensing result SAO in response to the control signal PMUX. The latch circuit 320 includes an inversion circuit 321 and a latch 322. The inversion circuit 321 is connected between the first and fourth nodes Na and Nd, and operates in response to the control signal PMUX. The inversion circuit 321 is composed of sixth and seventh PMOS transistors P6 and P7, sixth and seventh NMOS transistors N6 and N7, and a first inverter IN1. When the control signal PMUX is raised to a high level, the inversion circuit 321 outputs an inverse signal from a voltage level of the first node Na. The latch 322 includes second and third inverters IN2 and IN3.

The dummy latch circuit 330 is connected to the second node Nb of the sensing circuit 310. The dummy latch circuit 330 includes an eighth PMOS transistor P8 and an eighth NMOS transistor N8. The eighth PMOS transistor P8 includes a drain and source coupled to each other and a gate coupled to the second node Nb. The eighth PMOS transistor P8 receives the power source voltage VCC through the source terminal. The source and drain of the eighth NMOS transistor N8 are coupled to each other, and the gate thereof is coupled to the second node Nb. The source of the eighth NMOS N8 is connected to the ground terminal. Here, it should be noted that the drains of the eighth PMOS and NMOS transistors P8 and N8 are not connected to each other. The dummy latch circuit 330 is provided to equalize loadings against the first and second nodes Na and Nb.

Figure 7:
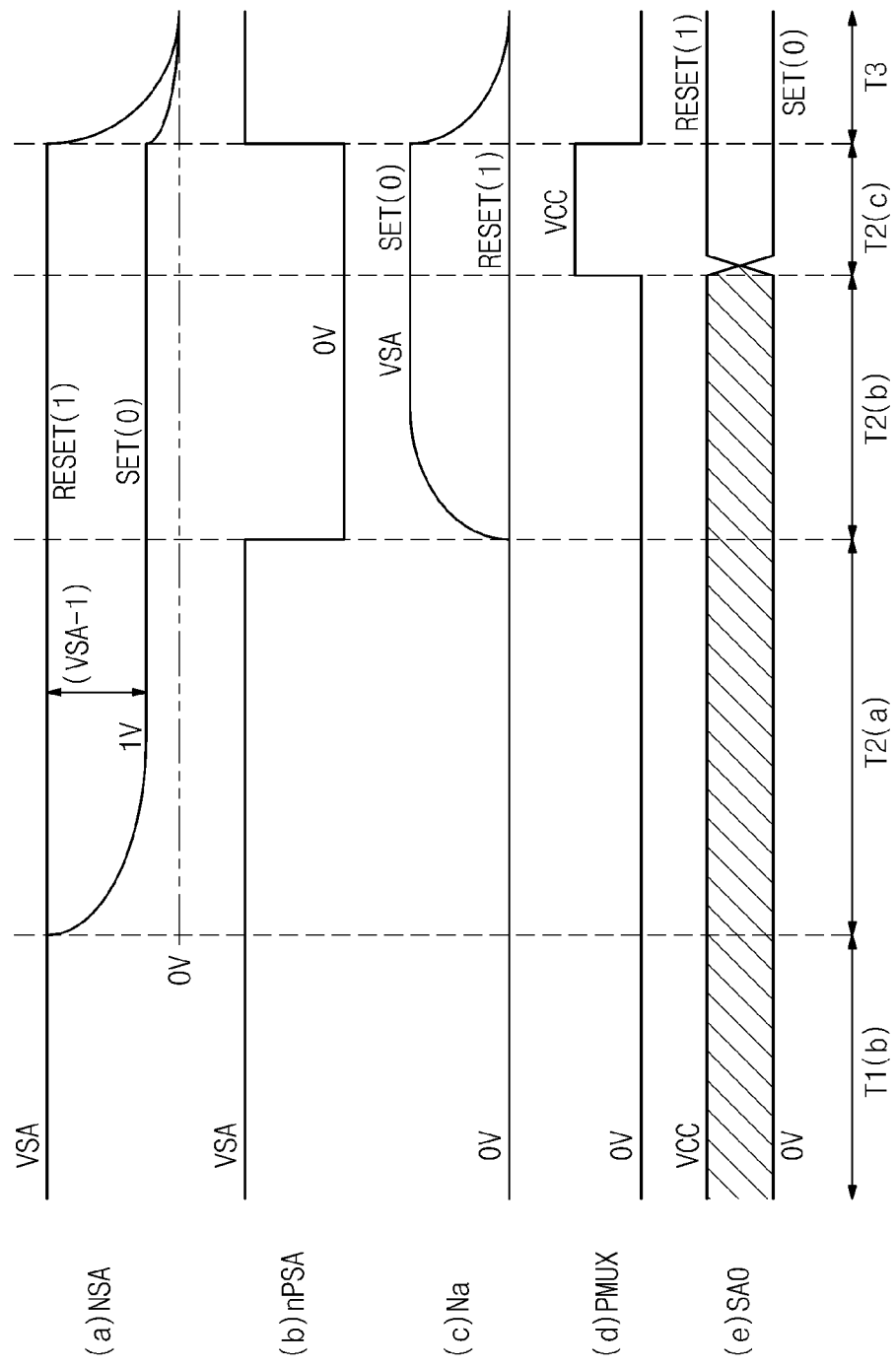
FIG. 7 is a timing diagram for use in explaining an operation of the sense amplifier shown in FIG. 6.

FIG. 7 is a timing diagram for use in explaining the operation of the sense amplifier shown in FIG. 6. More particularly, FIG. 7 is directed to an operation of the sense amplifier 170 during the sensing period T2 (FIG. 5). The voltage level of the sensing node NSA shown in FIG. 7 is same as that shown in FIG. 5.

During the first sensing period T1(b), the first control signal nPSA is set at the high voltage VSA and the second control signal PMUX is set at a low level. As the first control signal nPSA is at the high voltage VSA, the first and second nodes Na and Nb are held at the ground voltage level.

In a first sensing period T2(a), a voltage level of the sensing node NSA is variable as a function of the state of the selected memory cell 111. The sensing node NSA retains the high voltage VSA when the memory cell 111 is in the reset state, but will go down to 1V if the memory cell 111 is in the set state.

In the second sensing period T2(b), the first control signal nPSA transitions to the ground voltage GND. As shown in FIG. 6, the third PMOS transistor P3 is turned on while the third through fifth NMOS transistors N3-N5 are turned off. During this time, the sense circuit 310 conducts the sensing operation by comparing a voltage of the sensing node NSA to the reference voltage Vref. If the voltage of the sensing node NSA is higher than the reference voltage Vref, the first node Na goes to the ground voltage. If the voltage of the sensing node NSA is lower than the reference voltage Vref, the first node Na goes to the high voltage VSA. In other words, the first node Na lowers to the ground voltage when the selected memory cell 111 is conditioned in the reset state, and rises to the high voltage VSA when the selected memory cell 111 is conditioned in the set state.

In a third sensing period T2(c), the second control signal PMUX is activated. Responding to the activation of the second control signal, the latch circuit 320 inverts the voltage level of the first node Na and outputs the sensing result SAO. As shown in FIG. 7, the output node of the sense amplifier 170 is held in the previous state until the end of the second sensing period T2(b). During the third sensing period T2(c), the output node of the sense amplifier 170 will change to either the power source voltage VCC or the ground voltage GND in response to the control signal PMUX. That is, when the first node Na is charged up to the high voltage VSA, the output voltage SAO (i.e., the sensing result) lowers to the ground voltage GND. On the other hand, when the first node Na is set on the ground voltage GND, the output voltage SAO rises to the level of the power source voltage VCC.

In the discharging period T3, the first control signal nPSA rises to the high voltage VSA and the second control signal PMUX lowers to the ground voltage GND. Referring to FIG. 6, the third PMOS transistor P3 of the sensing circuit 310 is turned off while the third through fifth NMOS transistors N3-N5 are turned on. During this time, the first and second nodes Na and Nb are discharged to the ground voltage GND, and the latch 322 will hold the current voltage level of the output node.

Figure 8:
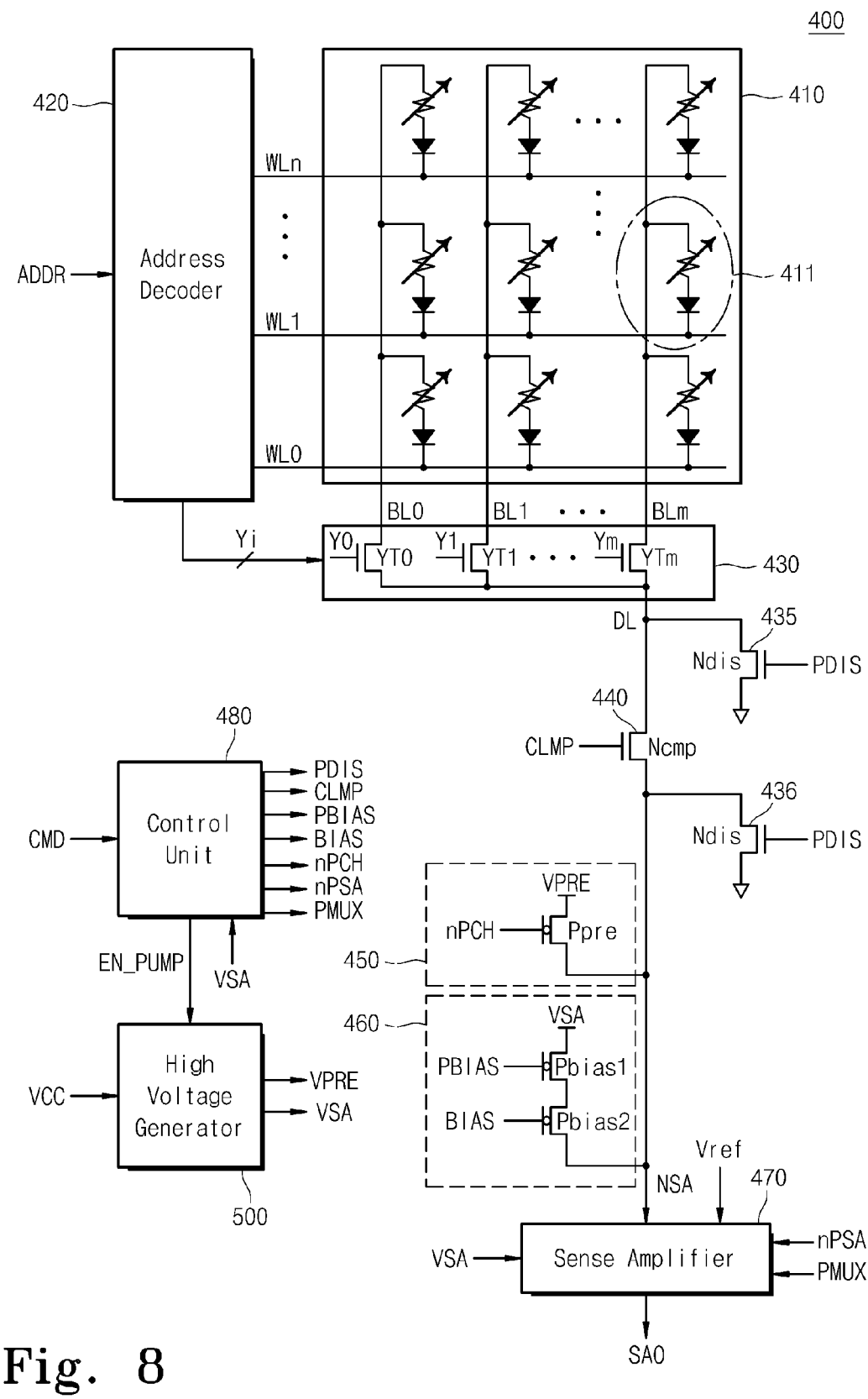
FIG. 8 is a block diagram illustrating structural features of a resistance-variable memory device in accordance with another illustrative embodiment of the inventive concepts.

FIG. 8 is a block diagram illustrating structural features of a resistance-variable memory device in accordance with another embodiment of the inventive concepts. As shown in FIG. 8, the resistance-variable memory device 400 of this example is comprised of a memory cell array 410, an address decoder 420, a bitline selection circuit 430, discharging circuits 435 and 436, a clamping circuit 440, a precharging circuit 450, a bias circuit 460, a sense amplifier 470, a control unit 480 and a high voltage circuit 500. With the exception of the precharging circuit 450 and the high voltage generator 500, the structure and operation of the resistance-variable memory device 400 shown in FIG. 8 are same as that of FIG. 4 in structure and operation. Accordingly, to avoid redundancy in the description, the discussion that follows next is primarily directed to the precharging circuit 450 and high voltage generator of FIG. 8.

The precharging circuit 450 preliminarily sets the sensing node NSA to a precharging voltage VPRE before the sensing operation of the sense amplifier 470. During this time, the selected bitline BLm is precharged up to the clamping voltage (e.g., 1V). The precharging circuit 450 is connected between the power terminal and the sensing node NSA, receives the precharging voltage VPRE through the power terminal, and precharges the sensing node NSA to the precharging voltage VPRE in response to a precharging signal nPCH. The precharging signal nPCH is provided from the control unit 480.

Referring to FIG. 8, the precharging circuit 450 of this example is composed of a PMOS transistor Ppre. The PMOS transistor Ppre is formed of a gate to which the precharging signal nPCH is applied, a source connected to the precharging voltage VPRE, and a drain connected to the sensing node NSA. The bulk (not shown) of PMOS transistor Ppre is boosted by the high voltage VSA.

The precharging voltage VPRE is supplied from the high voltage circuit 500. The precharging voltage VPRE is lower than the high voltage VSA and is generated independently of the high voltage VSA that is to be applied to the bias circuit 460 and the sense amplifier 470. The reason for lowering the precharging voltage VPRE relative to the high voltage VSA is to lessen the capacitive burden of the high voltage circuit 500.

That is, as discussed previously, the bitline BL has a large loading capacity. Thus, the higher the bitline precharging voltage generated by the high voltage circuit 500, the higher the capacitive burden in generating the bitline precharging (e.g., the high voltage VSA) during the precharging period.

The embodiment of FIG. 8 is partially characterized by adopting a bitline precharging voltage VPRE which is less than the high voltage VSA in order to lessen such a capacitive burden of the high voltage circuit 500. Here, the precharging voltage VPRE is generated by the high voltage generator, and is less than the high voltage VSA and greater than power source voltage VCC. However, in one or more alternative embodiments, the precharging circuit 450 can instead charge the selected bitline BLm using either the power source voltage VCC (which is externally provided) or the reference voltage Vref (provided from the sense amplifier 470) as the precharging voltage VPRE.

In a sensing operation, the sensing node NSA rises to the high voltage VSA from the precharging voltage VPRE when the selected memory cell 111 is in the reset state. When the selected memory cell 111 is in the set state, the sensing node NSA lowers to 1V from the precharging voltage VPRE. As such, it is possible to assure a sufficient sensing margin in the sensing operation while reducing the capacitive burden of the high voltage circuit 500 during the precharging operation. The precharging mechanism utilizing the precharging voltage VPRE will be described in more detailed in conjunction with FIG. 9.

Figure 9:
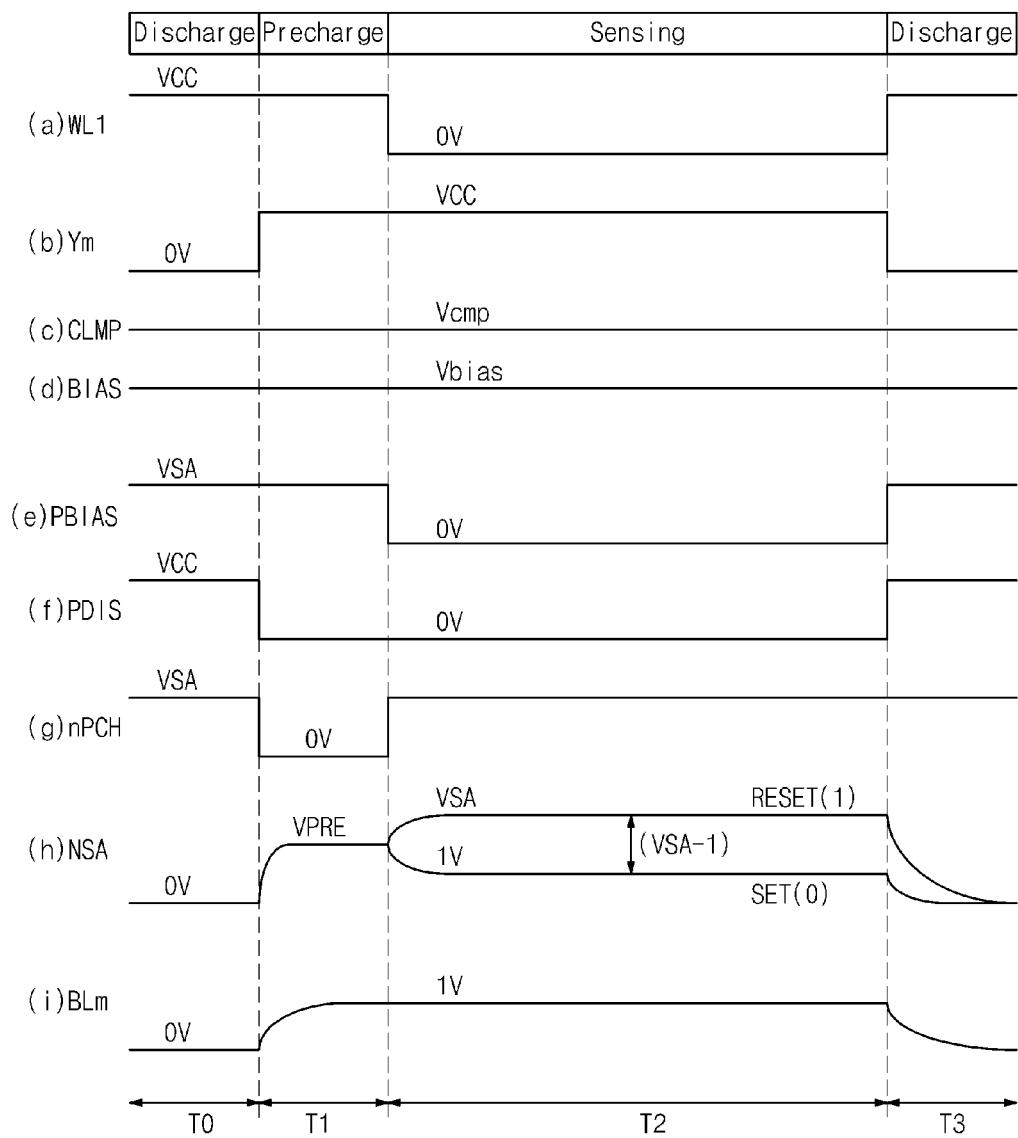
FIG. 9 is a timing diagram for use in explaining an operation of the resistance-variable memory device shown in FIG. 8.

FIG. 9 is a timing diagram explaining an operation of the resistance-variable memory device 400 shown in FIG. 8. Referring to FIG. 9, a read operation of the resistance-variable memory device 400 is carried out through sequential periods of discharging T0, precharging T1, sensing T2, and discharging T3. The discharging periods T0 and T3 are same with those shown and described previously in connection with FIG. 5.

In the precharging period T1, the sensing node NSA is set to the precharging voltage VPRE and the selected bitline BLm is precharged to the clamping voltage 1V. As shown in FIG. 9, the selection signal Ym rises to the high level and the discharge signal PDIS drops to a low level. The precharging signal nPCH also drops to a low level. When the selection signal Ym reaches a high level, the bitline BLm is electrically connected with the data line DL. When the discharge signal PDIS reaches a low level, the NMOS transistors Ndis of the discharging circuits 435 and 436 are turned off. When the precharging signal nPCH drops to a low level, the sensing node NSA is precharged up to the precharging voltage VPRE. If the sensing node NSA is charged up to the precharging voltage VPRE, a voltage of the selected bitline BLm rises to the clamping voltage 1V.

In the sensing period T2, the selected wordline WL1 is set to a low voltage level. When the wordline WL1 reaches a low level, a voltage level of the sensing node NSA is variably dependent upon a state of the selected memory cell 411. During the sensing period T2, the first bias signal PBIAS is held at the low level. As the first bias signal PBIAS transitions to a low level, a read current flows into the selected memory cell 411 through the bias circuit 460.

If the selected memory cell 411 is conditioned in the reset state, i.e., stores data '1', the sensing node NSA is charged so as to increase from the precharging voltage VPRE to the high voltage VSA. The voltage of the sensing node NSA rises to the high voltage VSA because the read current is being supplied to thereto through the bias circuit 460. On the other hand, if the selected memory cell 411 is conditioned in the set state. i.e., stores data '0', the voltage level of the sensing node NSA decreases from the precharging voltage VPRE to around 1V. That is, the voltage level of the sensing node NSA does not go to the ground level GND in this case due to the threshold voltage of the diode of the memory cell. In the period T2, the sense amplifier 470 is activated to conduct its sensing operation.

Figure 10:
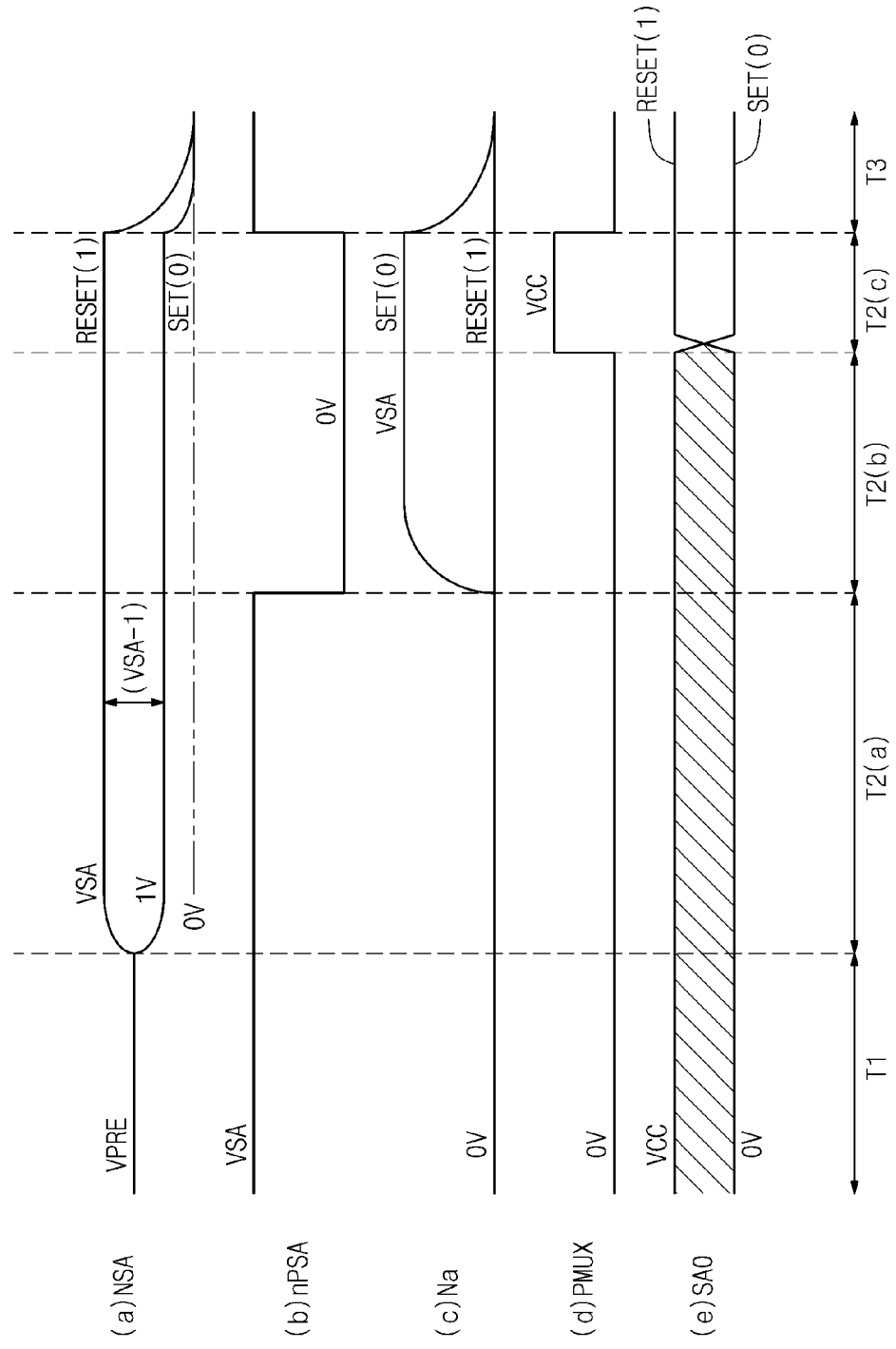
FIG. 10 is a timing diagram for use in explaining an operation of the sense amplifier shown in FIG. 8.

FIG. 10 is a timing diagram for further explaining an operation of the sense amplifier shown in FIG. 8. In a first sensing period T2(a), a voltage level of the sensing node NSA is variably dependent on a state of the selected memory cell 411. As explained above, the sensing node NSA rises to the high voltage VSA when the memory cell 411 is conditioned in the reset state, and drops to around 1V when the memory cell 411 is conditioned in the set state. Other features of the sensing operation represented by the timing diagram of FIG. 10 are same with those shown and described previously in connection with FIG. 7, and accordingly, a detailed description of the remainder of FIG. 10 is omitted here to avoid redundancy.

As shown in FIG. 10, and like the embodiment of FIG. 4, the present embodiment of FIG. 8 advantageously provides a relatively wide sensing margin VSA-1V, thereby enhancing the stability of a read operation.

Further, as explained previously, the embodiment of FIG. 8 utilizes the precharging voltage VPRE (which is lower than the high voltage VSA) to lessens the capacitive burden of the high voltage circuit 500 during the precharging operation.

The embodiments described above are directed to a resistance-variable memory device utilizing single level cell (SLC) memory cells in which one bit of data is stored in each memory cell.

However, the inventive concepts may also be applied to a multi-level cell (MLC) memory device in which two or more bits of data are stored in each cell.

Moreover, the resistance-variable memory device according to embodiments of the inventive concepts may be applied to a memory device including a reference cell, which may be used to achieve various purposes such as temperature compensation. The resistance-variable memory device according to embodiments of the inventive concepts may perform a sensing operation, illustrated in FIG. 5 or 9, for the reference cell.

Figure 11:
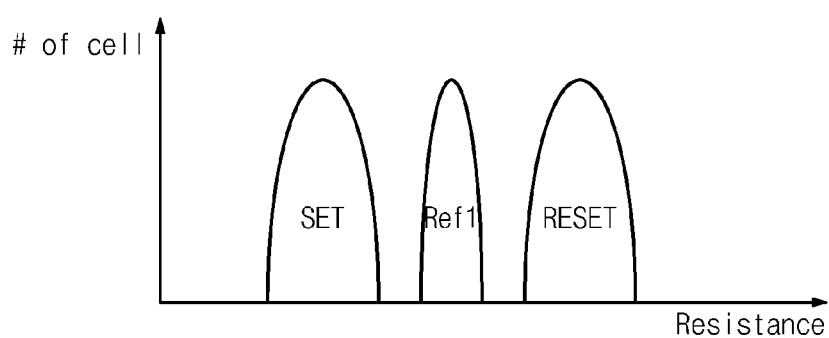
FIGS. 11 through 14 are threshold voltage distribution diagrams for use in explaining a resistance variable memory device according to an embodiment of the inventive concepts.
Figure 12:
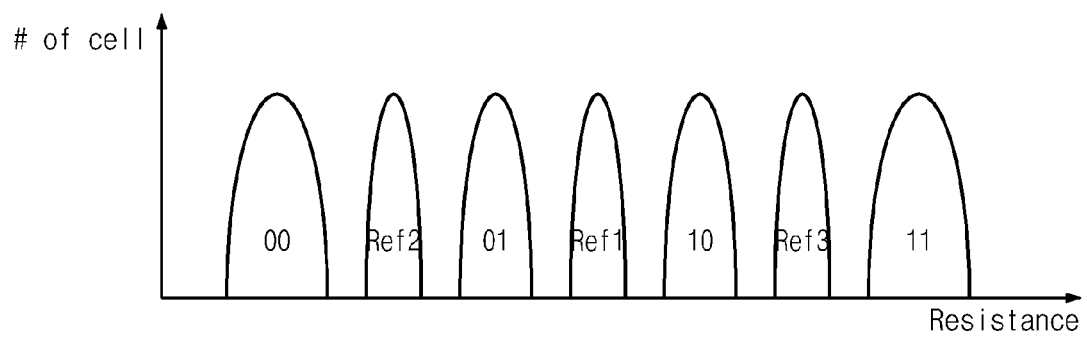
Figure 13:
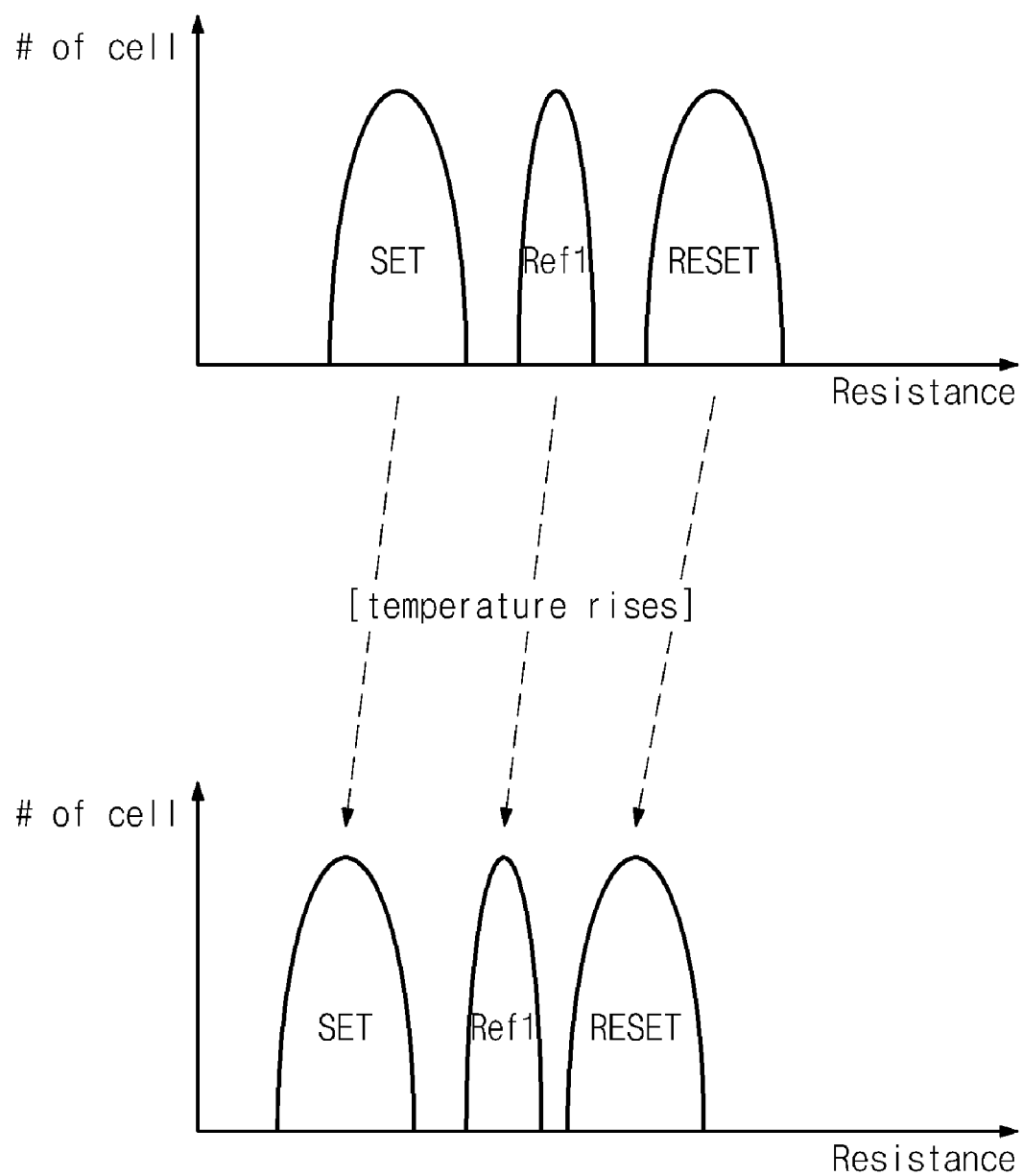
Figure 14:
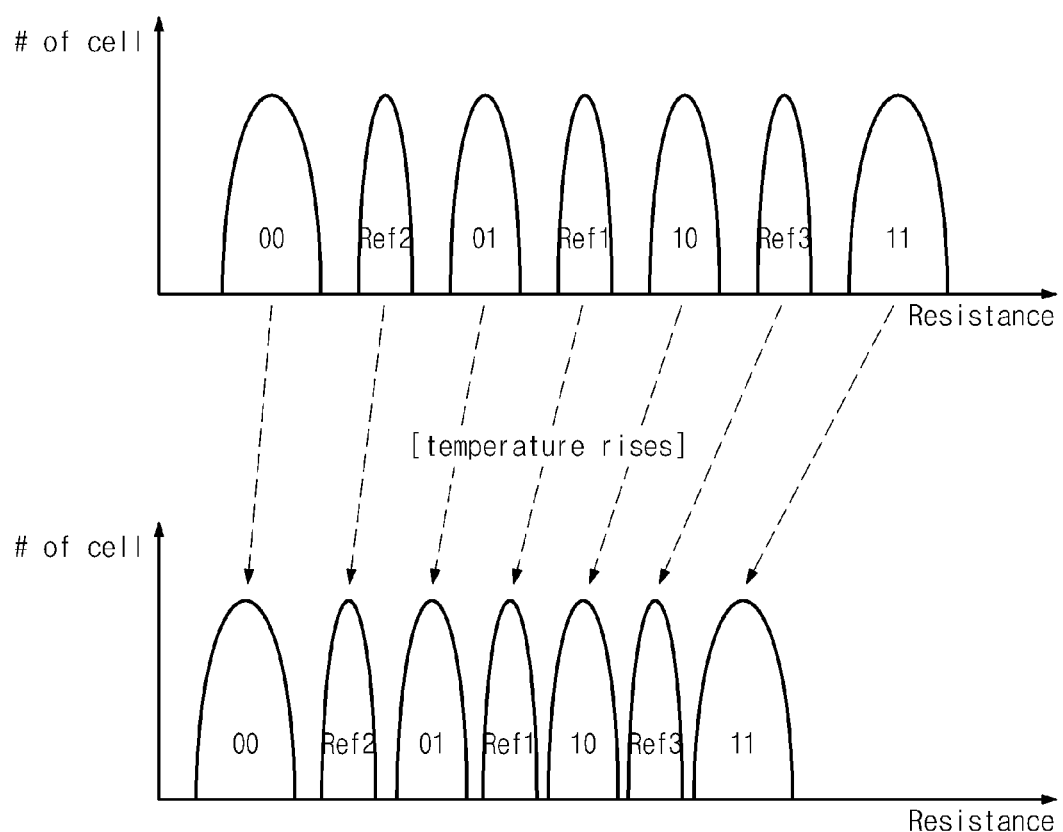

FIGS. 11 through 14 are cell resistance distribution diagrams for explaining a resistance variable memory device according to embodiments of the present inventive concepts. Specifically, FIGS. 11 and 13 are diagrams related to single-level cells (i.e., 1 bit-level cells), and FIGS. 12B and 14 are diagrams related to multi-level cells (i.e., n bit-level cells where "n" is a natural number equal to or greater than two).

In the resistance-variable memory device according to embodiments of the present inventive concepts, each resistance-variable memory cell has any one of a plurality of first resistance distributions. Here, the first resistance distributions do not overlap each other, that is, are separated from each other to secure a margin therebetween.

For example, when the resistance-variable memory cells are single-level cells, the first resistance distributions may include two ($=2^1$) resistance distributions, i.e., a set resistance distribution SET and a reset resistance distribution RESET, as illustrated in FIG. 11. Here, each of the resistance-variable memory cells may have resistance corresponding to any one of the first resistance distributions.

When the resistance-variable memory cells are multi-level cells, each of the resistance-variable memory cells may have any one of $2^n$ different kinds of resistance distributions. For example, when the resistance-variable memory cells are 2 bit multi-level cells, the first resistance distributions may include four ($=2^2$) resistance distributions, i.e., 00, 01, 10, and 11, as illustrated in FIG. 12. Here, each of the resistance-variable memory cells may have resistance corresponding to any one of the four resistance distributions. In addition, each of the resistance distributions 00, 01, 10, and 11 may be determined by the amount of amorphous material contained in a phase-change material. For example, the resistance distribution 00 may be determined when the phase-change material is crystalline, and the amount of amorphous material contained in the phase-change material may increase in the order of the resistance distributions 01, 10, and 11.

The resistance-variable memory device according to embodiments of the inventive concepts may also include one or more reference cells for adjusting the amount of compensation current or clamping current to enhance the reliability of a read operation. The reference cells may be identical to the resistance-variable memory cells. That is, like the resistance-variable memory cells, the reference cells each may include a variable resistance element and a selection element, and the variable resistance element may be a phase-change material.

Each of the reference cells has a second resistance distribution. The second resistance distributions may not overlap the first resistance distributions of the resistance-variable memory cells.

When the resistance-variable memory cells are single-level cells, the reference cells have one resistance distribution Ref1, as illustrated in FIG. 11. On the other hand, when the resistance-variable memory cells are multi-level cells (i.e., n bit-level cells), the reference cells have $2^n-1$ resistance distributions. For example, when the resistance-variable memory cells are 2 bit multi-level cells, three different resistance distributions Ref1, Ref2, and Ref3 may be generated as illustrated in FIG. 12. Consequentially, when the resistance-variable memory cells are m bit-level cells ("m" is a natural number), the reference cells have $2^m-1$ resistance distributions.

Referring to FIGS. 11 and 12, any one of the second resistance distributions may be located between two adjacent ones of the first resistance distributions. For example, referring to FIG. 12, the resistance distribution Ref2 is located between the resistance distributions 00 and 01, the resistance distribution Ref1 is located between the resistance distributions 01 and 10, and the resistance distribution Ref3 is located between the resistance distributions 10 and 11.

Referring to FIG. 13, the resistance distributions of the resistance-variable memory cells and the resistance distributions of the reference cells change as temperature rises. That is, as temperature rises, the reset resistance distribution RESET is reduced more significantly than the set resistance distribution SET. Therefore, as temperature rises, a margin between the set resistance distribution SET and the reset resistance distribution RESET is reduced.

However, the arrangement of the set resistance distribution SET, the resistance distribution Ref1 of the reference cells, and the reset resistance distribution RESET remains unchanged before and after temperature rises. In addition, the set resistance distribution SET, the resistance distribution Ref1 of the reference cells, and the reset resistance distribution RESET still do not overlap each other. Therefore, the resistance of the reference cells may be used to clearly discriminate between set resistance and reset resistance.

Referring to FIG. 14, the resistance distributions of the resistance-variable memory cells and the resistance distributions of the reference cells change as temperature rises. That is, as temperature rises, the degree by which the resistance distribution is reduced increases in the order of the resistance distributions 00, 01, 10, and 11. Therefore, as temperature rises, margins between the resistance distributions 00, 01, 10, and 11 are reduced.

However, the arrangement of the resistance distributions 00, 01, 10, and 11, and the resistance distributions Ref1, Ref2, and Ref3 of the reference cells remains unchanged before and after temperature rises. In addition, the resistance distributions 00, 01, 10, and 11, and the resistance distributions Ref1, Ref2, and Ref3 of the reference cells still do not overlap each other. Therefore, the resistances of the reference cells may be used to clearly discriminate among resistances corresponding to the resistance distributions 00, 01, 10, and 11.

In some embodiments of the inventive concepts, the resistances of the reference cells are used to adjust the amount of compensation current or clamping current. As described above with reference to FIGS. 13 and 14, the resistance change of the reference cells according to temperature may fully reflect the resistance change of the resistance-variable memory cells according to temperature. That is, a change in the resistance of the reference cells according to temperature may be equal to a change in the resistance of the resistance-variable memory cells according to temperature. Therefore, the amount of compensation current or clamping current may fully reflect temperature changes.

The amount of compensation current or clamping current can be adjusted more accurately by using the resistance change of the reference cells. This is because the resistance change of the reference cells can accurately reflect the resistance change of the resistance-variable memory cells, since the reference cells and the resistance-variable memory cells are the same type of memory cells.

Examples of configurations for adjusting the amount of compensation current or clamping current using the reference cells will now be described.

Figure 15:
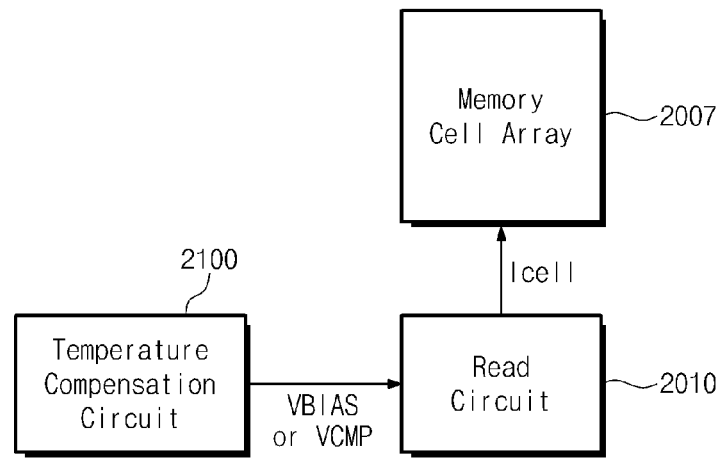
FIG. 15 is a block diagram of a resistance variable memory device according to an embodiment of the inventive concepts.

FIG. 15 is a block diagram of the resistance-variable memory device according to an embodiment of the inventive concepts. In connection with FIG. 15, a case will be described in which a verification read operation is performed using the resistance of the reference cells based on the description made with reference to FIGS. 11 through 14.

Referring to FIG. 15, the resistance-variable memory device according to the embodiment of the inventive concepts includes a memory cell array 2007, a read circuit 2010, and a temperature compensation circuit 2100.

The memory cell array 2007 includes a plurality of resistance-variable memory cells. Each of the resistance-variable memory cells has a resistance corresponding to any one of the first resistance distributions. That is, when the resistance-variable memory cells are single-level cells, each of the resistance-variable memory cells has the set resistance or the reset resistance. When the resistance-variable memory cells are multi-level cells (e.g., 2-bit level cells), each of the resistance-variable memory cells has resistance corresponding to any one of the resistance distributions 00, 01, 10, and 11.

The temperature compensation circuit 2100 includes one or more reference cells. Each of the reference cells has a resistance corresponding to any one of the second resistance distributions. That is, each of the reference cells may have the resistance distribution Ref1 as illustrated in FIG. 11, or may have any one of the resistance distributions Ref1 through Ref3 as illustrated in FIG. 12.

In the meantime, one or more reference cells may form a reference set. For example, the number of resistance distributions that the reference cells can have may be equal to the number of reference cells included in a reference set. When the resistance-variable memory cells are single-level cells, the reference cells may have one reference level Ref1. When the resistance-variable memory cells are multi-level cells (n bit-level cells), the reference cells may have $2^n-1$ resistance levels. Therefore, when the resistance-variable memory cells are single-level cells, a single reference cell may be adopted as the reference set. When the resistance-variable memory cells are multi-level cells (n bit-level cells), $2^n-1$ reference cells may be adopted as the reference set. For example, referring to FIG. 12, three ($=2^2-1$) reference cells may be included in a reference set. Consequently, when the resistance-variable memory cells are m bit-level cells ("m" is a natural number), $2^m-1$ reference cells are included in the same reference set.

The $2^m-1$ reference cells included in the same reference set may respectively have resistances corresponding to different resistance distributions. For example, when the resistance-variable memory cells are 2 bit-level cells, three reference cells may be included in the same reference set. Here, the three reference cells may respectively have resistances corresponding to different resistance distributions, i.e., Ref1 through Ref3.

The temperature compensation circuit 2100 may generate a compensation control signal VBIAS or a clamp control signal VCMP that changes according to the resistance of the reference cells. As described above with reference to FIGS. 13 and 14, the resistance of the reference cells changes according to temperature. Accordingly, the compensation control signal VBIAS or the clamp control signal VCMP also changes according to temperature. A more detailed example of the configuration and operation of the temperature compensation circuit 2100 will be described with reference to FIGS. 16 through 20.

Figure 16:
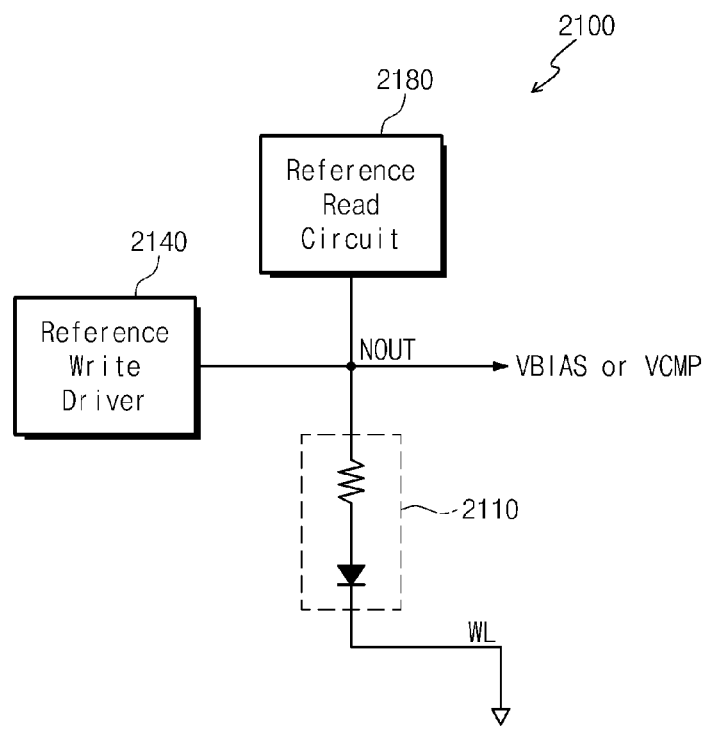
FIG. 16 is an exemplary block diagram of the temperature compensation circuit 2100 illustrated in FIG. 15.

FIG. 16 is an exemplary block diagram of the temperature compensation circuit 2100 illustrated in FIG. 15.

Referring to FIG. 16, the temperature compensation circuit 2100 includes a reference cell 2110, a reference write driver 2140, a reference read circuit 2180, and an output node NOUT.

The reference write driver 2140 is connected to the output node NOUT, supplies a write current to the reference cell 2110, and determines the resistance distribution of the reference cell 2110. A more detailed example of the structure of the reference write driver 2140 will be described later with reference to FIG. 17.

The reference read circuit 2180 is connected to the output node NOUT, supplies a read current to the reference cell 2110, and reads the resistance distribution of the reference cell 2110. That is, the reference read circuit 2180 identifies whether the resistance (i.e., resistance distribution) of the reference cell 2110 is located at a desired position.

When the resistance distribution of the reference cell 2110 is not located at the desired position, the reference write driver 2140 supplies a write current again to the reference cell 2110, and determines the resistance distribution of the reference cell 2110. When the resistance distribution of the reference cell 2110 is located at the desired position, the compensation control signal VBIAS or the clamp control signal VCMP, which changes according to the resistance level of the reference cell 2110, is output through the output node NOUT. The resistance distribution of the reference cell 2110 depends on the temperature.

An example of a detailed structure of the reference read circuit 2180 will be described later with reference to FIGS. 18 through 20.

The reference write driver 2140 may be a replica circuit of a write driver which determines resistance distributions of the resistance-variable memory cells by supplying a write current to the resistance-variable memory cells. The reference read circuit 2180 may be a replica circuit of a read circuit which reads the resistance distributions of the resistance-variable memory cells by supplying a read circuit to the resistance-variable memory cells. Since the reference cell 2110 is identical to each resistance-variable memory cell as described above, a change in the resistance of the reference cell 2110 according to temperature can fully reflect a change in the resistance of each resistance-variable memory cell according to temperature. Here, if the reference write driver 2140 and the reference read circuit 2180 are replica circuits, the resistance change of the reference cell 2110 according to temperature can more accurately reflect the resistance change of each resistance-variable memory cell according to temperature. However, the inventive concepts are not limited to the use of replica circuits as the reference write driver 2140 and the reference read circuit 2180.

Figure 17:
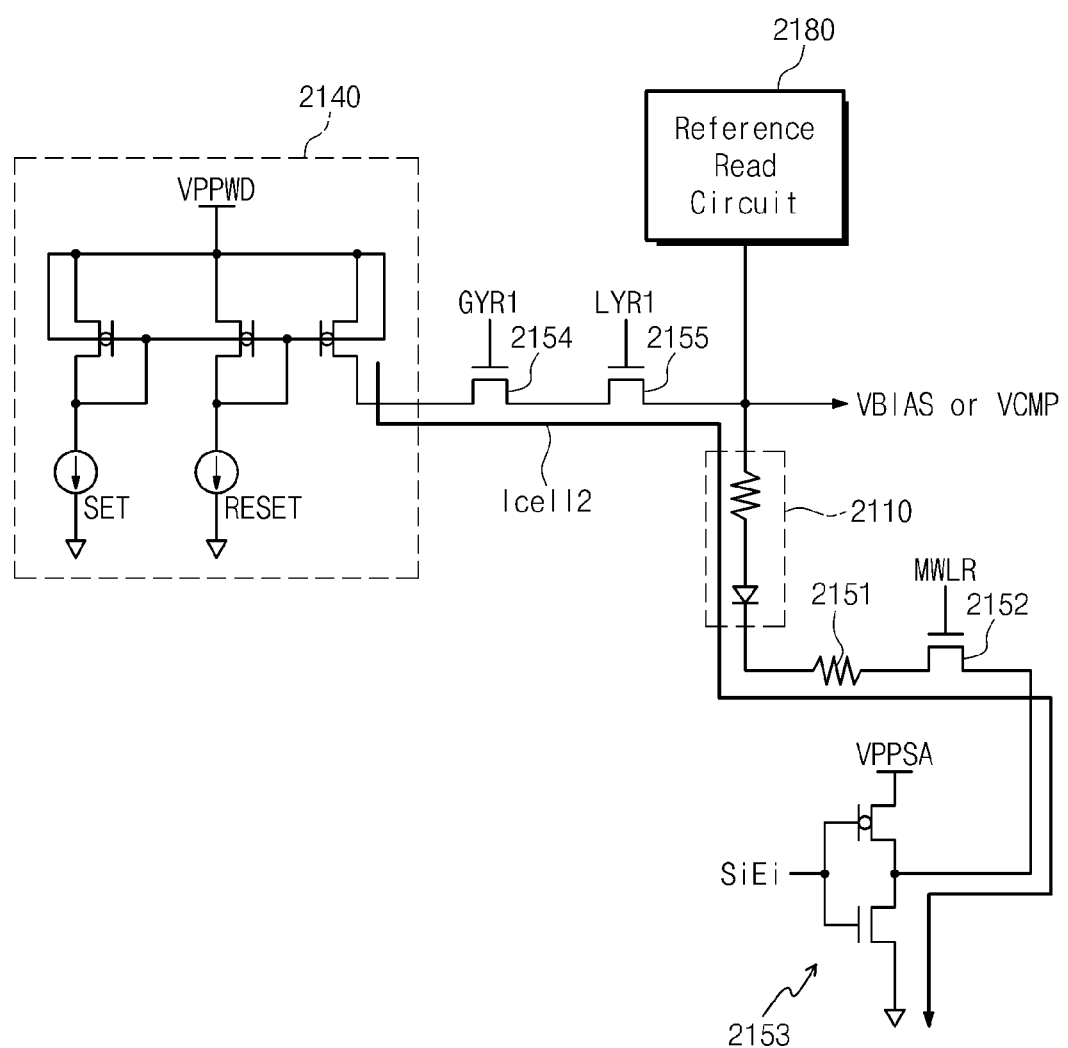
FIG. 17 is an exemplary circuit diagram of the reference write driver 2140 illustrated in FIG. 16 and a portion related to a write operation.

FIG. 17 is an exemplary circuit diagram of the reference write driver 2140 illustrated in FIG. 16 and a portion related to a write operation.

Referring to FIG. 17, the reference write driver 2140 supplies a write current Icell2 to write set data or reset data.

As illustrated in FIG. 17, the write current Icell2 is output to a ground source via a first transistor 2154, a second transistor 2155, the reference cell 2110, a first resistor 2151, a third transistor 2152, and then an inverter 2153.

Here, a global column select replica signal GYR1 is transmitted to the first transistor 2154, a row column select replica signal LYR1 is transmitted to the second transistor 2155, and a main word line replica signal MWLR is transmitted to the third transistor 2152. That is, the first transistor 2154 is a replica of a global column select circuit, the second transistor 2155 is a replica of a row column select circuit, and the third transistor 2152 is a replica of a main word line select circuit. In addition, the first resistor 2151 is a replica of a resistor in an active region of a substrate. A path of the write current Icell2 used to write the reference cell 2110 may be made identical to a path of a write current used to write a resistance-variable memory cell by configuring the first transistor 2154, the second transistor 2155, the first resistor 2151, the third transistor 2152, and the inverter 2153 as described above.

Figure 18:
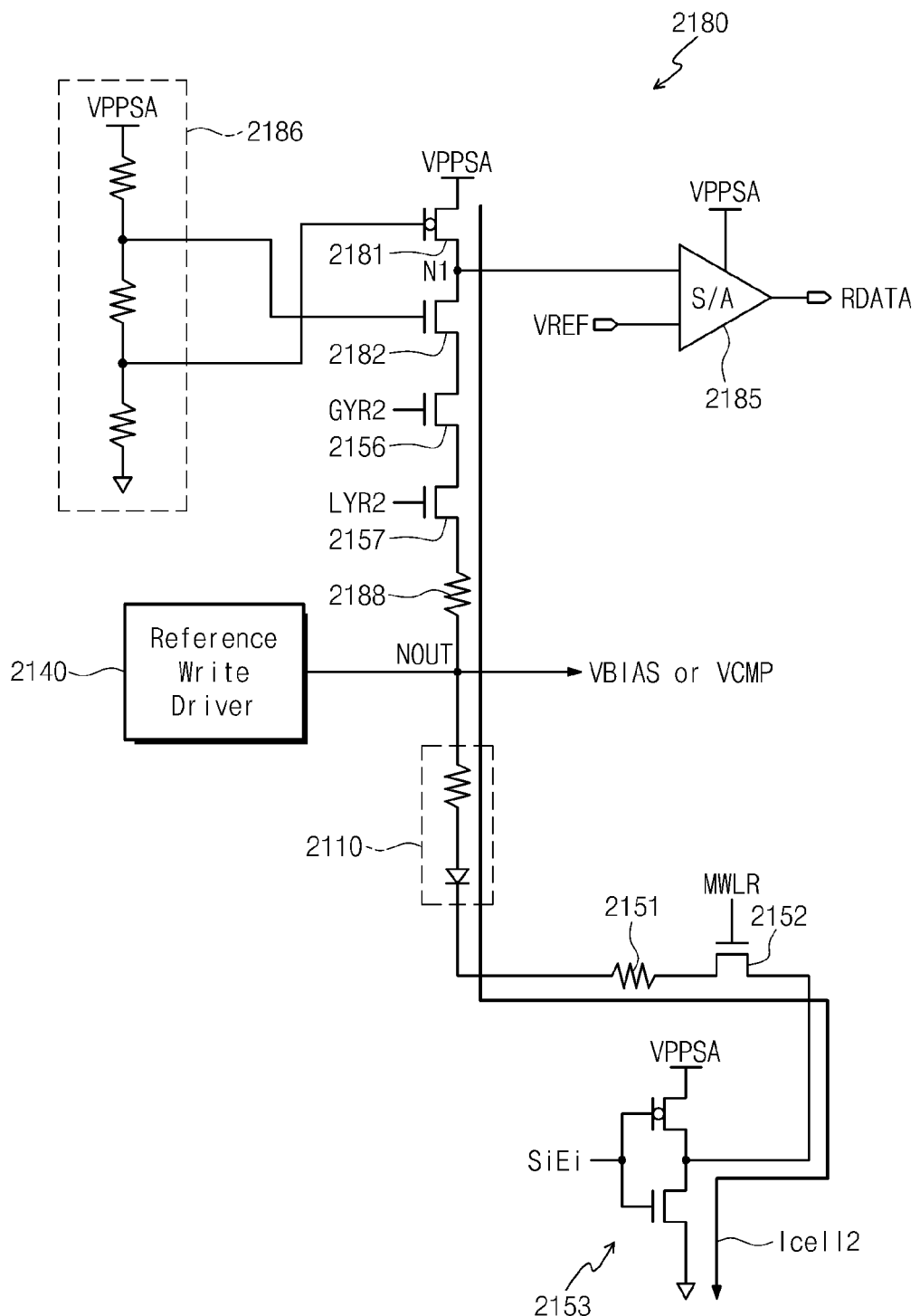
FIG. 18 is an exemplary circuit diagram of the reference read circuit 2180 illustrated in FIG. 16 and a portion related to a read operation.

FIG. 18 is an exemplary circuit diagram of the reference read circuit 2180 illustrated in FIG. 16 and a portion related to a read operation.

Referring to FIG. 18, the reference read circuit 2180 includes a fourth transistor 2181, a fifth transistor 2182, a sense amplifier 2185, a resistor string 2186, and a second resistor 2188.

The fourth transistor 2181 and the fifth transistor 2182 are connected in series between a step-up voltage source VPPSA and an output node NOUT. A plurality of resistors in the resistance string 2186 is connected in series between the step-up voltage source VPPSA and a ground source and provides a first voltage and a second voltage. The first voltage is applied to a gate of the fourth transistor 2181, and the second voltage is applied to a gate of the fifth transistor 2182. Here, the fourth transistor 2181 is a replica of the compensation unit, and the fifth transistor 2182 is a replica of the clamping unit. The second resistor 2188 is, but not limited to, a replica of a bit line.

As illustrated in FIG. 18, a read current Icell3 is output to the ground voltage source via the step-up voltage source VPPSA, the fourth transistor 2181, the fifth transistor 2182, a sixth transistor 2156, a seventh transistor 2157, the second resistor 2188, the reference cell 2110, the first resistor 2151, the third transistor 2152, and then the inverter 2153.

Here, a global column select replica signal GYR2 is transmitted to the sixth transistor 2156, and a local column select replica signal LYR2 is transmitted to the seventh transistor 2157. That is, the sixth transistor 2156 is a replica of a global column select circuit, and the seventh transistor 2157 is a replica of a local column select circuit. A path of the read current Icell3 used to read the reference cell 2110 may be made identical to a path of a read current used to read a resistance-variable memory cell by configuring the fourth transistor 2181, the fifth transistor 2182, the sixth transistor 2156, the seventh transistor 2157, the first resistor 2151, the third transistor 2152, and the inverter 2153 as described above.

The sense amplifier 2185 outputs reference data RDATA by comparing a node N1 and a reference voltage VREF. The reference data RDATA is read to determine whether the resistance of the reference cell 2110 has a desired value.

When the resistance of the reference cell 2110 does not have the desired value, a write operation is performed again.

When the resistance of the reference cell 2110 has the desired value, the compensation control signal VBIAS or the clamp control signal VCMP may be output through the output node NOUT. For example, the voltage of the output node NOUT may also be output as the compensation control signal VBIAS or the clamp control signal VCMP.

Alternatively, as will be described with reference to FIG. 20, the voltage of the output node NOUT may be adjusted through trimming, and the adjusted voltage of the output node NOUT may be output as the compensation control signal VBIAS or the clamp control signal VCMP.

Alternatively, the resistance of the second resistor 2188 may be controlled to adjust a voltage that is output to the output node NOUT. This is because the voltage output to the output node NOUT may be a voltage divided by the resistance of the second resistor 2188 and that of the reference cell 2110. Here, it is assumed that the resistances of the fourth transistor 2181, the fifth transistor 2182, the sixth transistor 2156, the seventh transistor 2157, and the third transistor 2152 are significantly small. Since the resistance of the reference cell 2110 will be determined by a write operation, if the resistance of the second resistor 2188 is adjusted in a manufacturing process, the voltage output to the output node NOUT can be readily adjusted.

Figure 19:
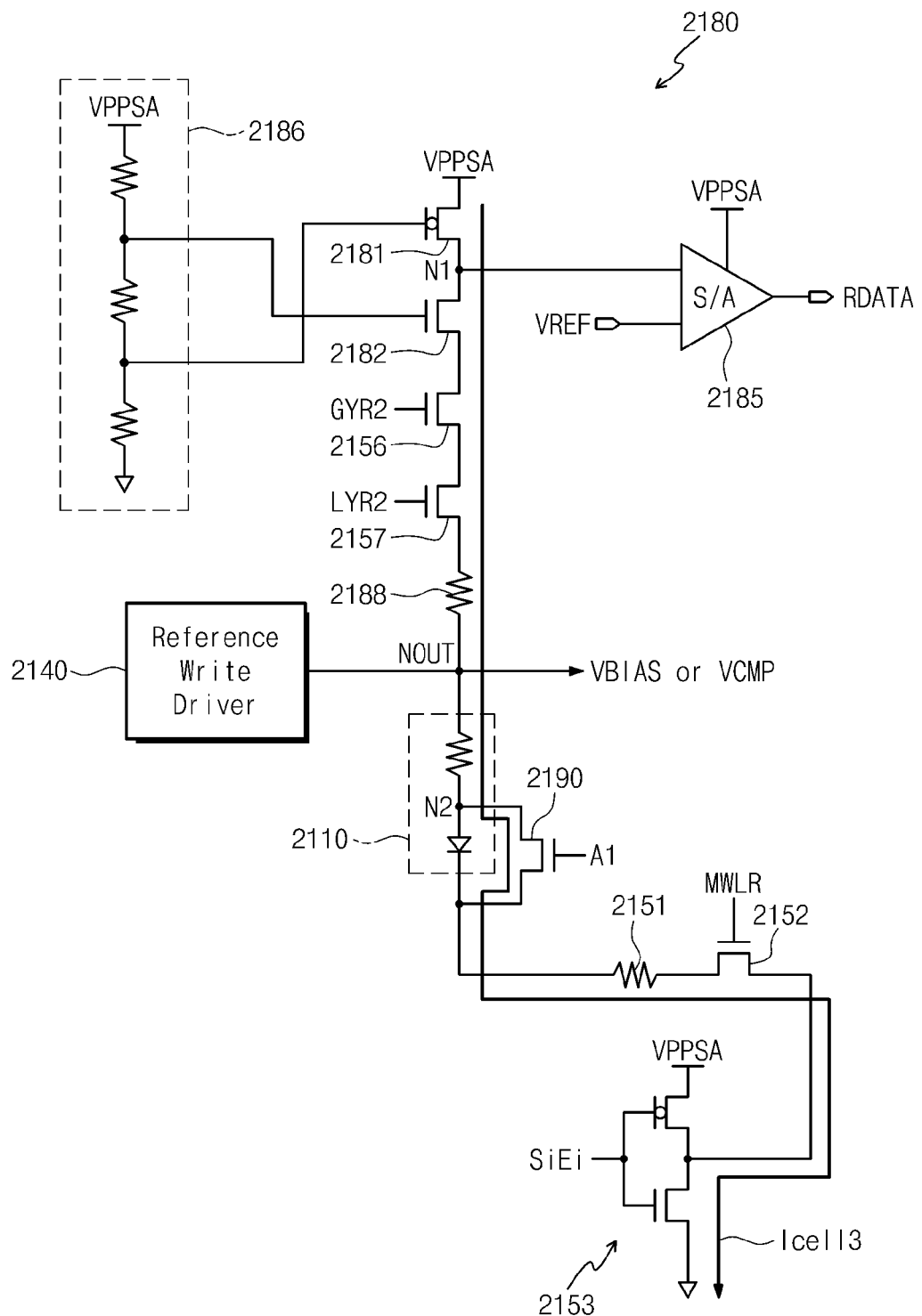
FIG. 19 is another exemplary circuit diagram of the reference read circuit 2180 illustrated in FIG. 16 and a portion related to a read operation.

FIG. 19 is another exemplary circuit diagram of the reference read circuit 2180 illustrated in FIG. 16 and a portion related to a read operation.

The circuit of FIG. 19 differs from that of FIG. 18 in that it further includes a bypass circuit 2190. When a reference cell 2110 is read, the bypass circuit 2190 is turned on in response to a control signal A1. Therefore, while a read current Icell3 passes through a variable resistance element, it bypasses an access element (that is, a diode).

After the reference cell 2110 is read, if it is found that the resistance of the reference cell 2110 does not have a desired value, the reference cell 2110 must be re-programmed. Thus, it is desirable to minimize the time required to read the reference cell 2110. The bypass circuit 2190 is implemented to reduce a period of time required by the read current Icell3 to pass through an n-type semiconductor of the diode, thereby reducing the total read time.

On the other hand, when a write operation is performed, the bypass circuit 2190 is turned off so that a current flows toward the access element (the diode).

Figure 20:
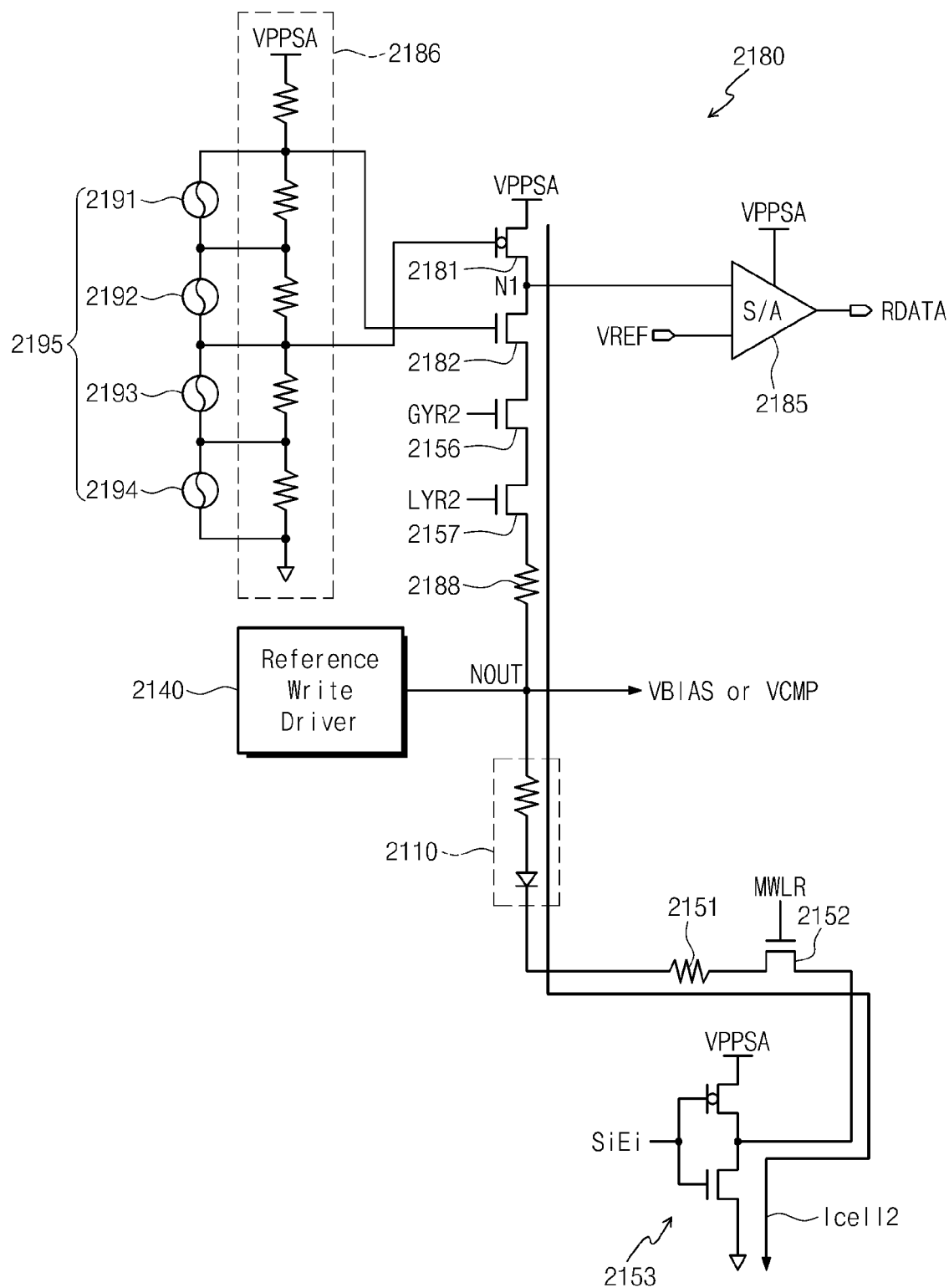
FIG. 20 is another exemplary circuit diagram of the reference read circuit 2180 illustrated in FIG. 16 and a portion related to a read operation.

FIG. 20 is another exemplary circuit diagram of the reference read circuit 2180 illustrated in FIG. 16 and a portion related to a read operation.

The circuit of FIG. 20 differs from that of FIG. 18 in that it further includes a trimming circuit 2195. The trimming circuit 2195 may include a plurality of fuses 2191 through 2194.

At least one of the fuses 2191 through 2194 may be cut using a mode resister set (MRS) to adjust the level of voltage applied to a fourth transistor 2181 and a fifth transistor 2182.

A voltage value of a compensation control signal VBIAS or a clamp control signal VCMP output through an output node NOUT may be adjusted using the trimming circuit 2195. That is, even when the resistance of a reference cell 2110 has a desired value, if the voltage value of the compensation control signal VBIAS or the clamp control signal VCMP needs to be precisely adjusted, the trimming circuit 2195 can be used.

Figure 21:
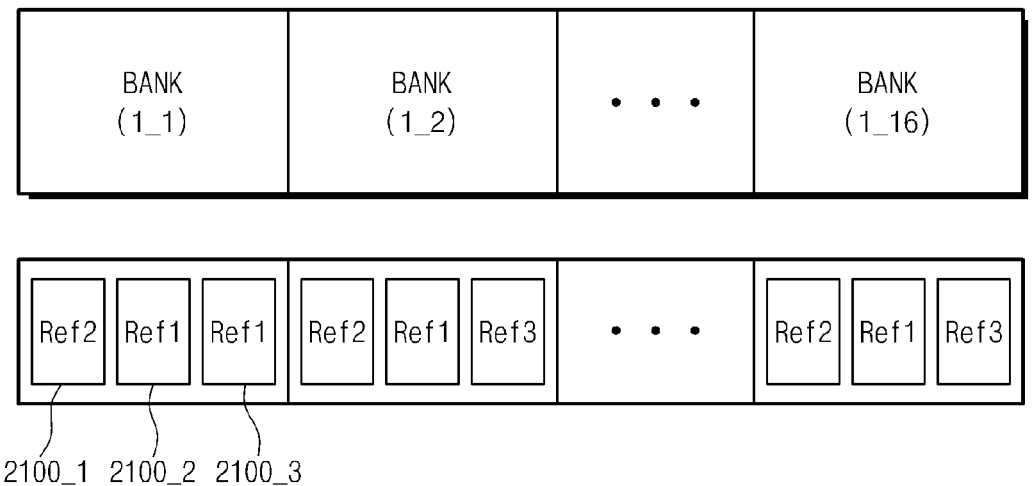
FIG. 21 is a block diagram for use in explaining a resistance variable memory device according to an embodiment of the inventive concepts.

FIG. 21 is a diagram for explaining a resistance-variable memory device according to another embodiment of the inventive concepts.

The circuit of FIG. 21 may be implemented using similar circuitry as that of FIG. 18 (or 19 or 20), except that FIG. 21 represents an embodiment in which a plurality of reference sets are respectively disposed corresponding to a plurality of memory banks. As described above, when resistance-variable memory cells are 2 bit-level cells, there may be three ($=2^2-1$) reference cells, and each of the three reference cells may store a resistance value corresponding to one of resistance distributions Ref1 through Ref3. Therefore, as illustrated in FIG. 21, three temperature compensation circuits 2100_1 through 2100_3 may corresponds to each of the memory banks 1_1 through 1_16. Each of the three temperature compensation circuits 2100_1 through 2100_3 includes a corresponding one of the three reference cells.

Figure 22:
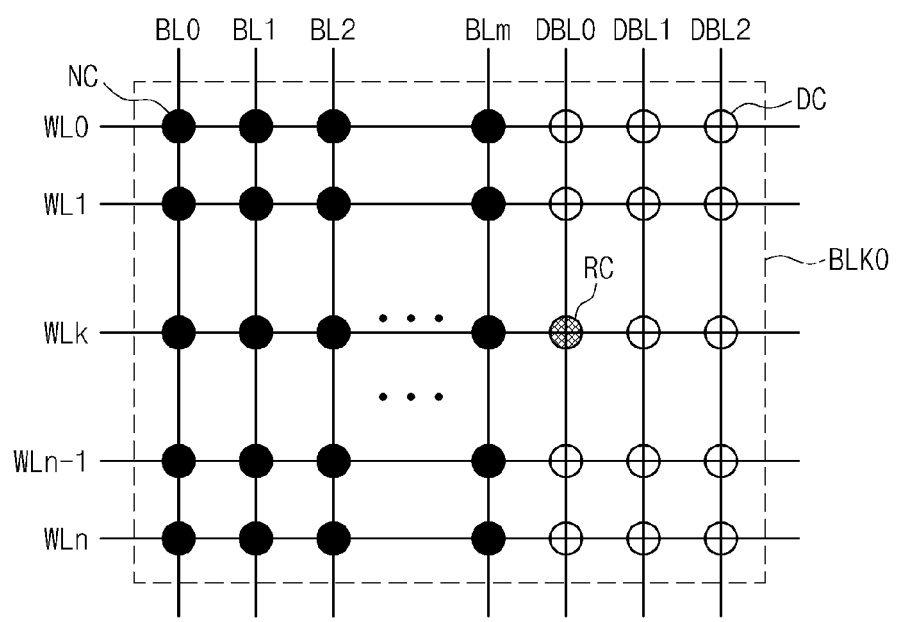
FIGS. 22 and 23 are memory array diagrams for use in explaining resistance variable memory devices according to embodiments of the inventive concepts.
Figure 23:
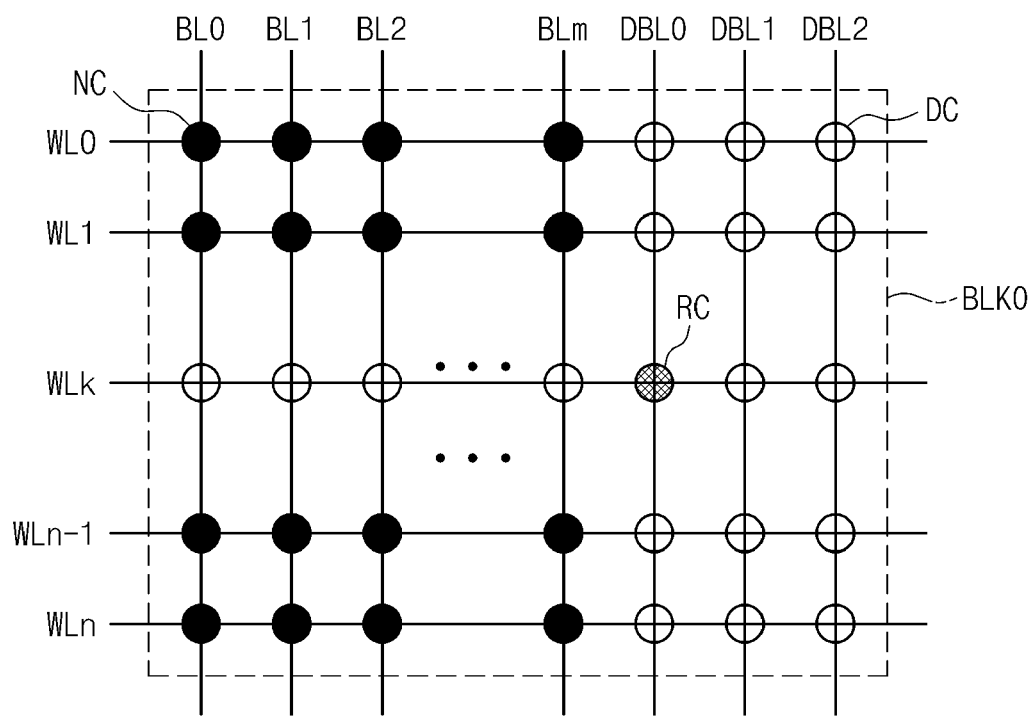

FIGS. 22 and 23 are diagrams for explaining resistance-variable memory devices according to other embodiments of the inventive concepts. In FIGS. 22 and 23, a memory block BLK0 is illustrated as an example, and the above-described reference cell is included in the memory block BLK0.

Referring to FIG. 22, normal memory cells NC are connected between word lines WL0 through WLn and bit lines BL0 through BLm. In addition, dummy memory cells DC are connected between dummy bit lines DBL0 through DBL2 and the word lines WL0 through WLn. In addition, in the example of FIG. 22, a reference cell RC is connected between the dummy bit line DBL0 and the word line WLk.

The normal memory cells NC are cells in which data is stored. The configuration of the dummy memory cells DC may be identical to that of the normal memory cells NC. However, the dummy memory cells DC are cells in which no data is stored. As described above, the reference cell RC is a cell used to adjust the amount of compensation current or clamping current by reflecting temperature changes.

As illustrated in FIG. 22, the reference cell RC may be located approximately in the middle of the dummy bit line DBL0 to prevent edge loading.

Referring to the example of FIG. 23, the normal memory cells NC here are not connected to the word line WLk that is connected to the reference cell RC. That is, only the dummy memory cells DC in addition to the reference cell RC are connected to the word line WLk.

Whenever data stored in all normal memory cells NC in the memory block BLK0 is read, the reference cell RC may also be read. Accordingly, the word line WLk connected to the reference cell RC is very frequently connected to a ground source. Thus, if the normal memory cells NC are connected to the word line WLk, they may be adversely affected. For this reason, the normal memory cells NC of the example of FIG. 23 are not connected to the word line WLk that is connected to the reference cell RC.

Figure 24:
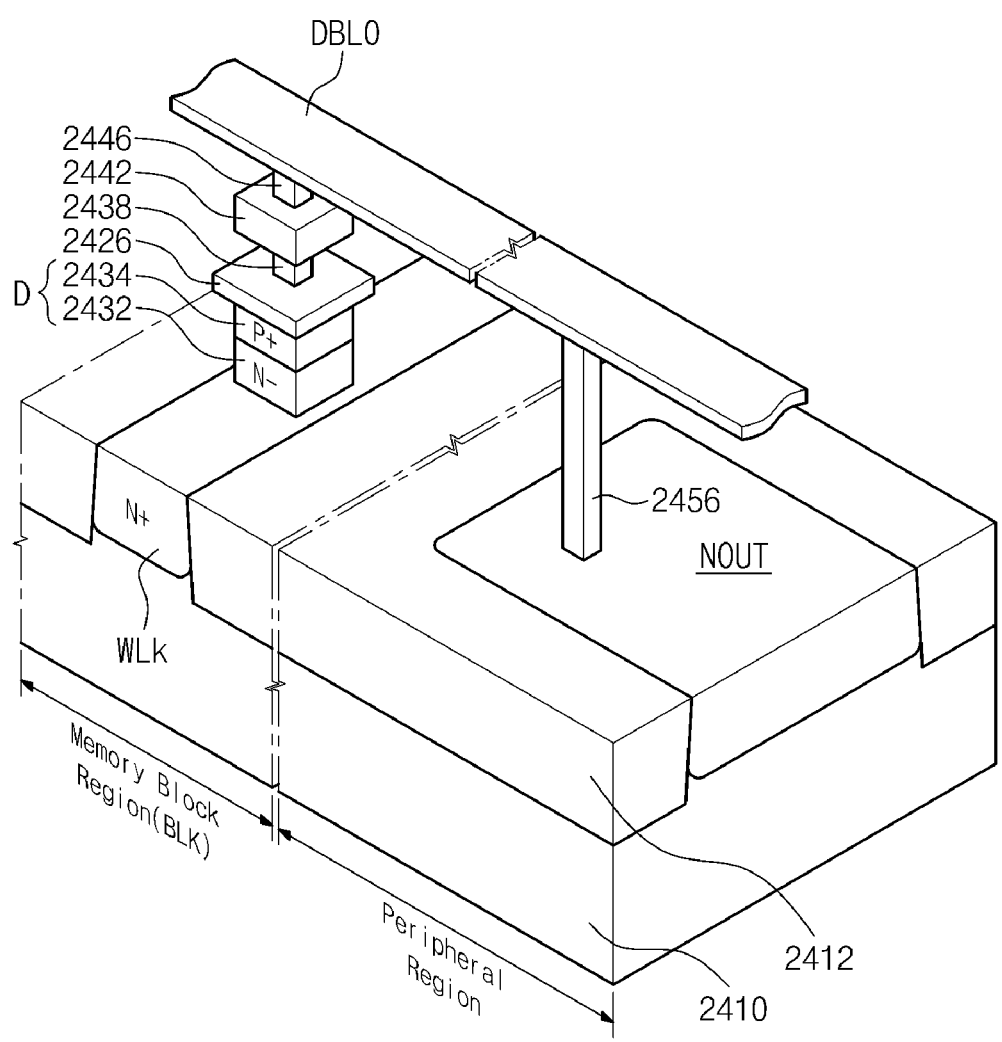
FIG. 24 is a perspective view of a resistance variable memory device according to an embodiment of the inventive concepts.
Figure 25:
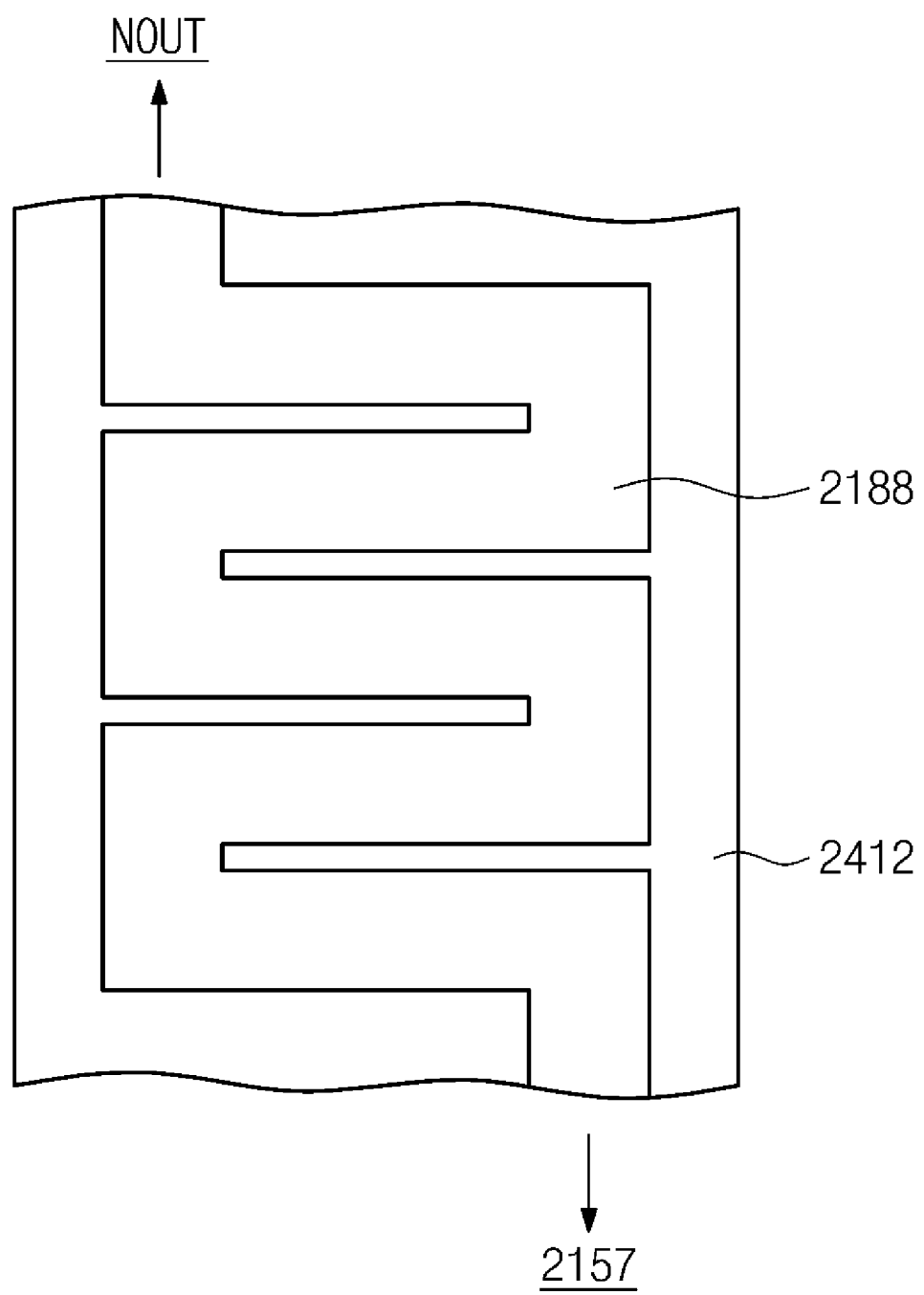
FIG. 25 is a layout diagram of a second resistor 2188 included in the resistance variable memory device according to an embodiment of the inventive concepts.

FIG. 24 is a perspective view of a resistance-variable memory device according to an embodiment of the inventive concepts. FIG. 25 is a layout diagram of a second resistor 2188 included in the resistance-variable memory device according to the embodiment of the inventive concepts.

When a reference cell RC is disposed within a memory block BLK0 as described above with reference to FIGS. 22 and 23, a reference write driver 2140 (FIG. 18) and a reference read circuit 2180 (FIG. 18) may be disposed in a peripheral region.

Specifically, referring to FIGS. 24 and 25, an element isolation region 2412 is formed on a substrate 2410 of a first conductivity type (e.g., a P type) to define a plurality of active regions. For example, an active region formed in the memory block BLK0 may extend in a first direction. The active region formed in the memory block BLK0 may be implanted with impurities of a second conductivity type (e.g., an N type) to form a word line WLk. The substrate 2410 may be a silicon substrate, a silicon-on-insulator (SOI) substrate, a gallium arsenic substrate, a silicon germanium substrate, or the like.

A method of forming the word line WLk by implanting the substrate 2410 of the first conductivity type with the impurities of the second conductivity type has been described above. However, the inventive concepts are not limited to this method. For example, the word line WLk may also be formed by epitaxial growth on the substrate 2410.

A first semiconductor pattern 2432 and a second semiconductor pattern 2434 are formed on the word line WLk to form a diode D. To form the first and second semiconductor patterns 2432 and 2434, for example, a mold pattern may be formed on the substrate 2410, and then a semiconductor pattern may be formed along the mold pattern using selective epitaxial growth or solid phase epitaxial (SPE) growth. Then, an ion implantation process may be performed.

An ohmic contact layer 2436 is formed on the diode D. The ohmic contact layer 2436 may be made of metal such as tungsten. In addition, the ohmic contact layer 2436 may be formed by physical vapor deposition (PVD), chemical vapor deposition (CVD), atomic layer deposition (ALD), or the like.

A bottom electrode contact 2438 is formed on the ohmic contact layer 2436. The bottom electrode contact 2438 may be made of a material selected from TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

A phase-change material 2442 is formed on the bottom electrode contact 2438.

A top electrode contact 2446 is formed on the phase-change material 2442. The top electrode contact 2446 may be omitted.

A dummy bit line DBL0 is formed on the top electrode contact 2446 and extends in a second direction which is different from the first direction. That is, the word line WLk and the dummy bit line DBL0 may intersect each other. The dummy bit line DBL0 may extend up to the peripheral region. The dummy bit line DBL0 may contain aluminum, copper, or the like. For example, the dummy bit line DBL0 may be a lowest metal wiring layer.

A specified active region (a region corresponding to an output node NOUT) in the peripheral region may be connected to the dummy bit line DBL0 by a contact 2456. Unlike the illustration in FIG. 24, the contact 2456 may include a plurality of contacts that are stacked in a vertical direction.

The second resistor 2188 may be implemented in various ways. For example, referring to FIG. 25, the second resistor 2188 may be implemented by forming an active region in a zigzag pattern in the substrate 2410. That is, the second resistor 2188 may be implemented in an active region between a region in which the output node NOUT is implemented and a region in which a seventh transistor 2157 is to be formed. When this zigzag pattern is repeated a number of times, a physical length of the active region can be increased. Thus, the resistance of the second resistor 2188 can be readily adjusted.

Figure 26:
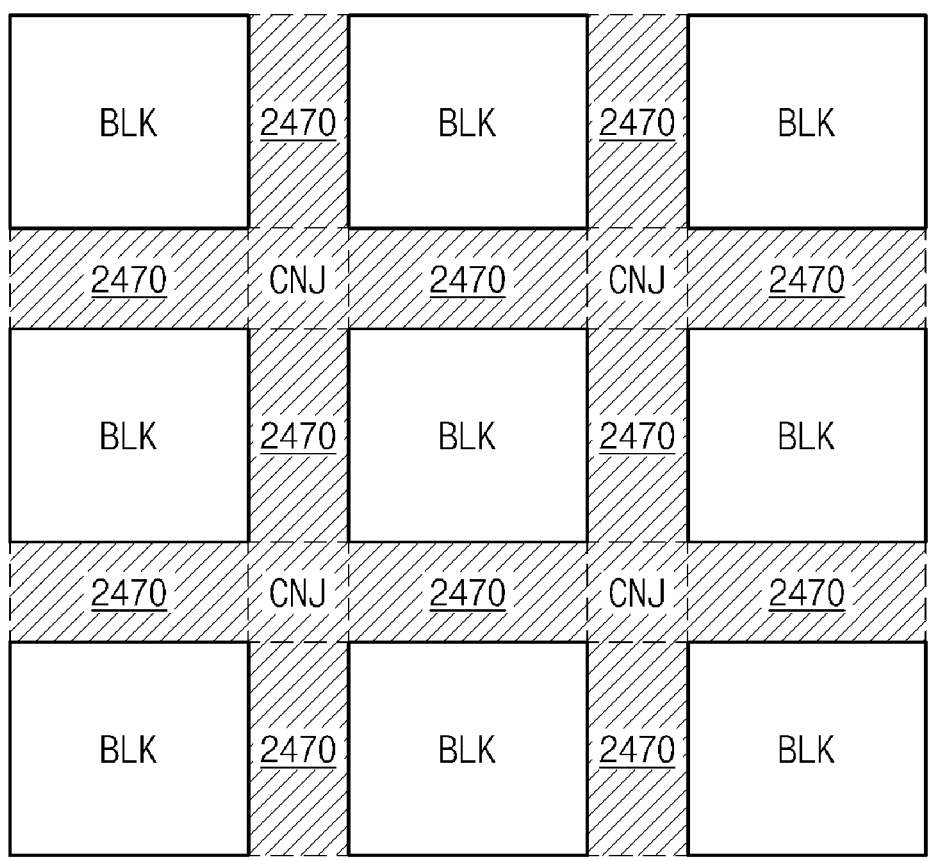
FIG. 26 is a layout diagram of a resistance variable memory device according to an embodiment of the inventive concepts.
Figure 27:
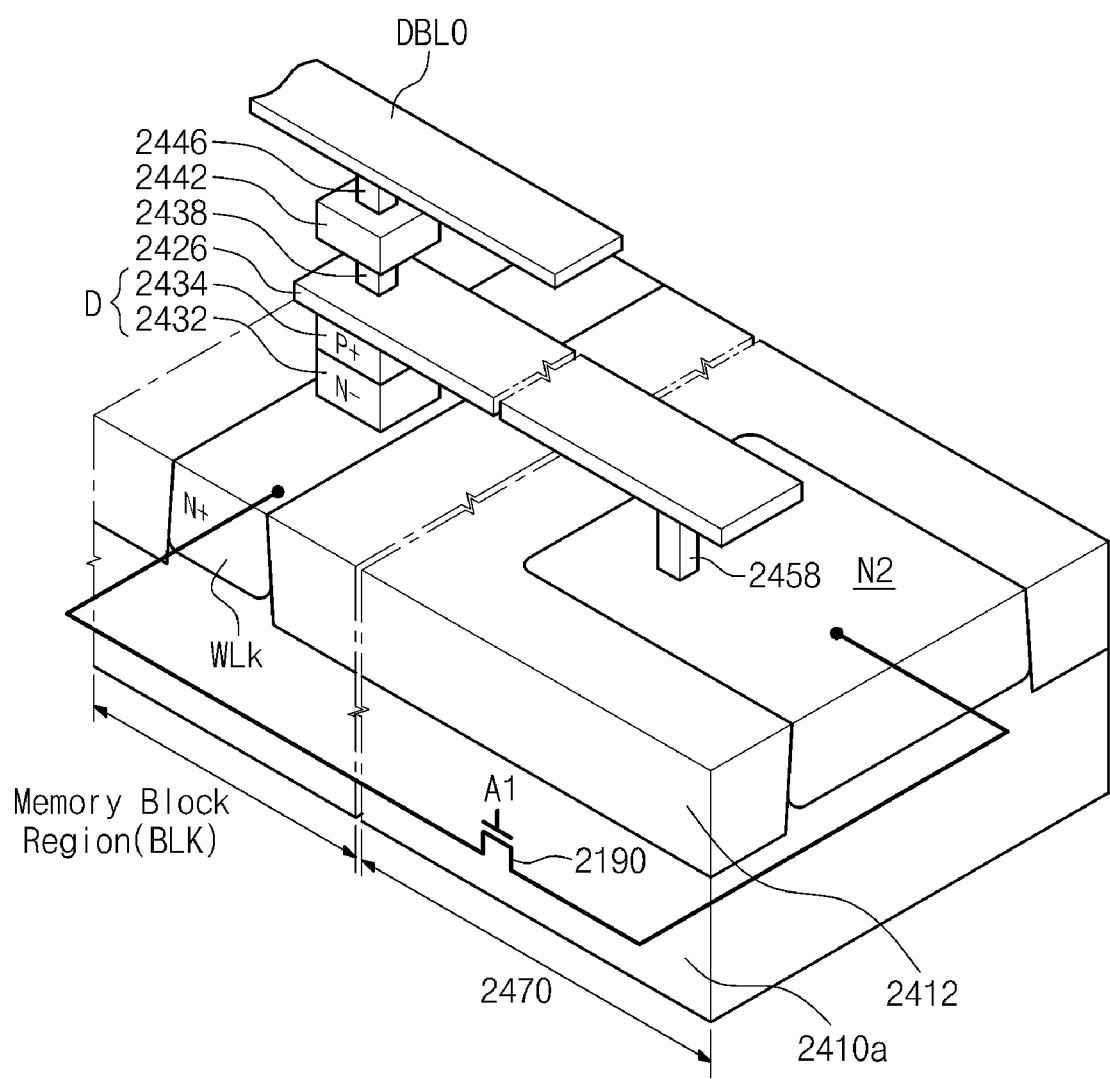
FIG. 27 is a perspective view of a resistance variable memory device according to an embodiment of the inventive concepts.

FIG. 26 is a layout diagram of a resistance-variable memory device according to an embodiment of the inventive concepts. FIG. 27 is a perspective view of the resistance-variable memory device according to the embodiment of the inventive concepts. The illustrations in FIGS. 26 and 27 may be for implementing the circuit (which further includes the bypass circuit 2190) illustrated in FIG. 16. Except as discussed below, the configuration of FIG. 27 is the same as that of FIG. 24, and thus only the differences therebetween are described to avoid redundancy in the description.

Referring to FIG. 26, a plurality of memory blocks BLK are arranged in a 3×3 matrix. Regions 2470, in each of which a local column select circuit is disposed, may be located between the memory blocks BLK, and a conjunction region CNJ may be located between neighboring ones of the regions 2470.

In the embodiment of the inventive concepts, a reference cell RC may be disposed in each memory block BLK, and a bypass circuit 2190 may be disposed in each region 2470 in which the local column select circuit is located or in the conjunction region CNJ.

In FIG. 27, the bypass circuit 2190 is implemented in each region 2470. Referring to the example of FIG. 27, an ohmic contact layer 2437 connected to the reference cell RC extends from a memory block region to each of the regions 2470. A node N2 implemented in an active region, which is defined in each region 2470, and the ohmic contact layer 2437 are connected to each other by a contact 2458.

The bypass circuit 2190 is formed in each region 2470 and connected between the node N2 and the word line WLk.

Figure 28:
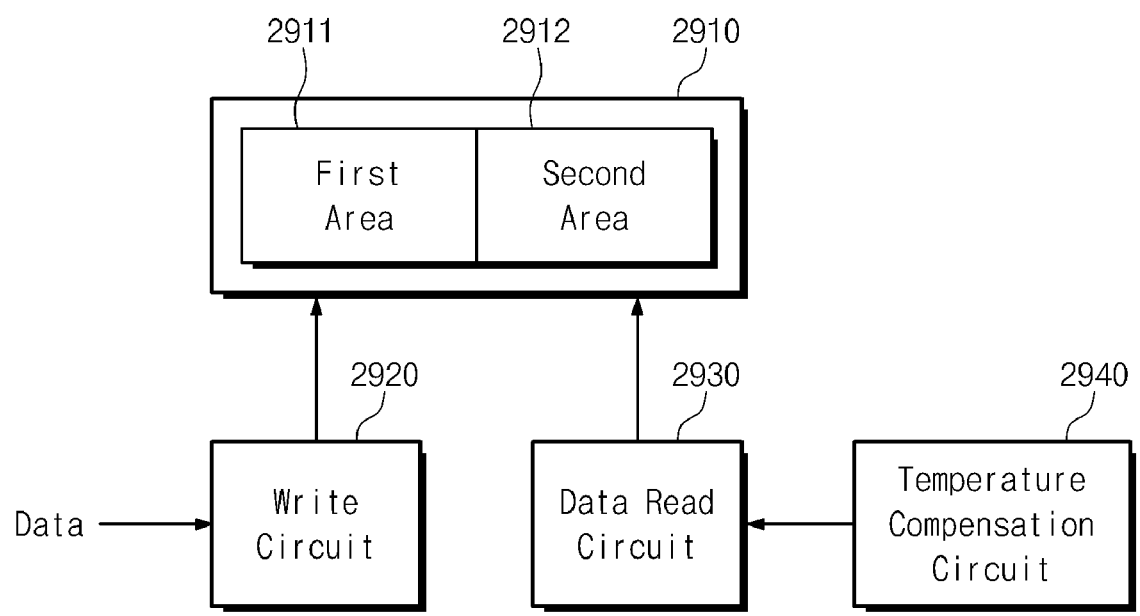
FIG. 28 is a block diagram for use in explaining a resistance variable memory device according to an embodiment of the inventive concepts.

FIG. 28 is a diagram for explaining a resistance-variable memory device according to an embodiment of the inventive concepts.

Referring to FIG. 28, the resistance-variable memory device of this example includes a cell array 2910, a temperature compensation circuit 2940, a data read circuit (for verification) 2930, and a write circuit 2920.

The memory cell array 2910 includes a plurality of resistance-variable memory cells and is divided into a first area 2911 and a second area 2912 which are different from each other. That is, the memory cell array 2910 may be divided into a plurality of areas, depending on functionality. The first area 2911 may have a shorter response time and a faster access time than the second area 2912. In addition, the first area 2911 may replace a main memory, and the second area 2912 may replace a hard disk drive (HDD).

As described above, the temperature compensation circuit 2940 may include one or more reference cells.

As described above, the data read circuit 2930 may perform a verifying-read operation by supplying a current, which changes according to the resistance of the reference cells, to one or more of the resistance-variable memory cells.

The write circuit 2920 examines data provided by an external source and writes the data to the first area 2911 or the second area 2912 based on the examination result. The data provided by the external source may include a code, which indicates whether the data must be stored in the first area 2911 or the second area 2912, in a data header. Therefore, the write circuit 2920 may examine the code and determine whether to write the data to the first area 2911 or the second area 2912.

The second area 2912 may have a hierarchical structure described above in the first through fourth embodiments. The resistance-variable memory device may include a global bit line, which is connected to a write circuit and a data read circuit, one or more local bit lines, which are coupled to the resistance-variable memory cells disposed in the second area 2912, and a plurality of column select transistors. Here, each of the column select transistors may selectively connect the global bit line to any one of the local bit lines.

The resistance of a column select transistor located far from the write circuit and the data read circuit may be smaller than that of a column select transistor located close to the write circuit and the data read circuit. Alternatively, the column select transistor located far from the write circuit and the data read circuit may be larger than the column select transistor located close to the write circuit and the data read circuit. The doping concentration of a channel region of the column select transistor located far from the write circuit and the data read circuit may be higher than that of a channel region of a column select transistor located close to the write circuit and/or the data read circuit.

The first area 2911 or the second area 2912 may include a temperature compensation circuit which includes a reference cell and which has been described above in connection with previous embodiments. Therefore, a verifying-read operation may be performed by supplying a current, which changes according to the resistance of one reference cell, to one or more of the resistance memory cells.

Figure 29:
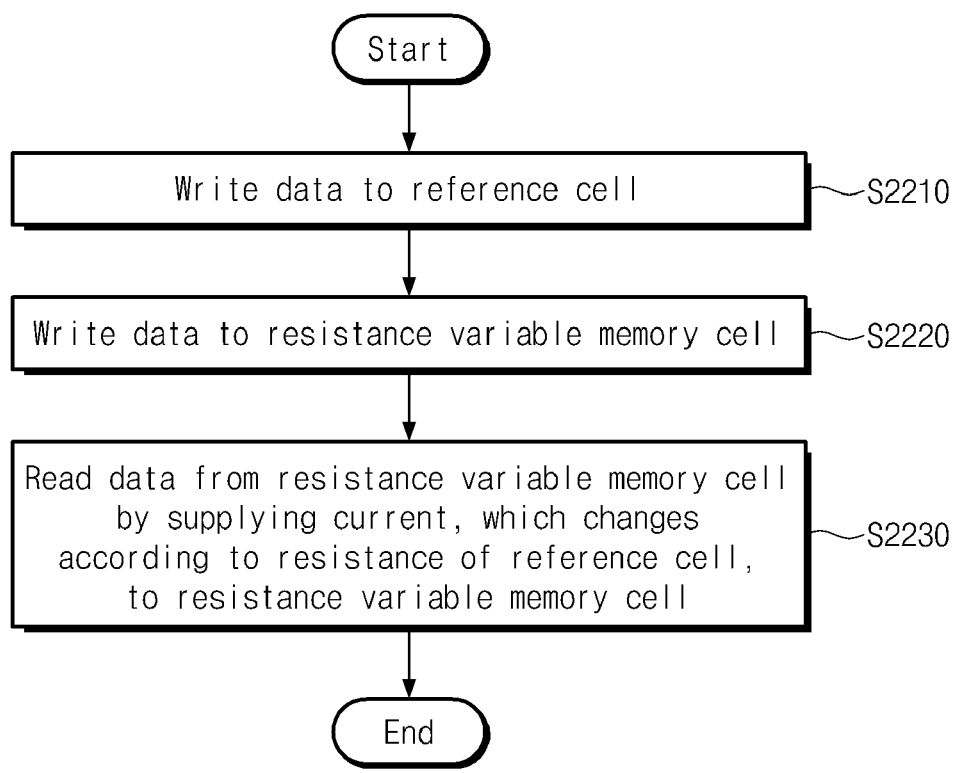
FIG. 29 is a flowchart illustrating a method of driving resistance variable memory devices according to embodiments of the inventive concepts.

FIG. 29 is a flowchart for use in describing a method of driving resistance-variable memory devices according to embodiments of the inventive concepts.

Referring to FIGS. 16 and 29, a memory cell array, which includes m bit-level cells ("m" is a natural number), and a reference set, which includes $2^m-1$ reference cells, are provided.

The resistance of the reference cells is read.

The $2^m-1$ reference cells included in one reference set are written such that the $2^m-1$ reference cells respectively have different resistance distributions (operation S2210).

For example, when the m bit-level cells are 2 bit-level cells, there may be three ($=2^2-1$) reference cells, and the three reference cells may respectively store resistance values corresponding to resistance distributions Ref1 through Ref3.

Data is then written to the m bit-level cells (operation S2220).

Then, a current, which changes according to the resistance of the $2^m-1$ reference cells, is supplied to the m bit-level cells to verifying-read data from the m bit-level cells (operation S2230).

For example, a compensation current, which changes according to a resistance value corresponding to each of the resistance distributions Ref1 through Ref3 sequentially, is supplied to the m bit-level cells in order to verifying-read data.

FIGS. 30 through 34 are diagrams for explaining storage systems according to embodiments of the inventive concepts. Specifically, FIGS. 30 through 34 illustrate storage systems using the resistance-variable memory devices adopting the inventive concepts associated with one or more of the embodiments described above.

Figure 30:
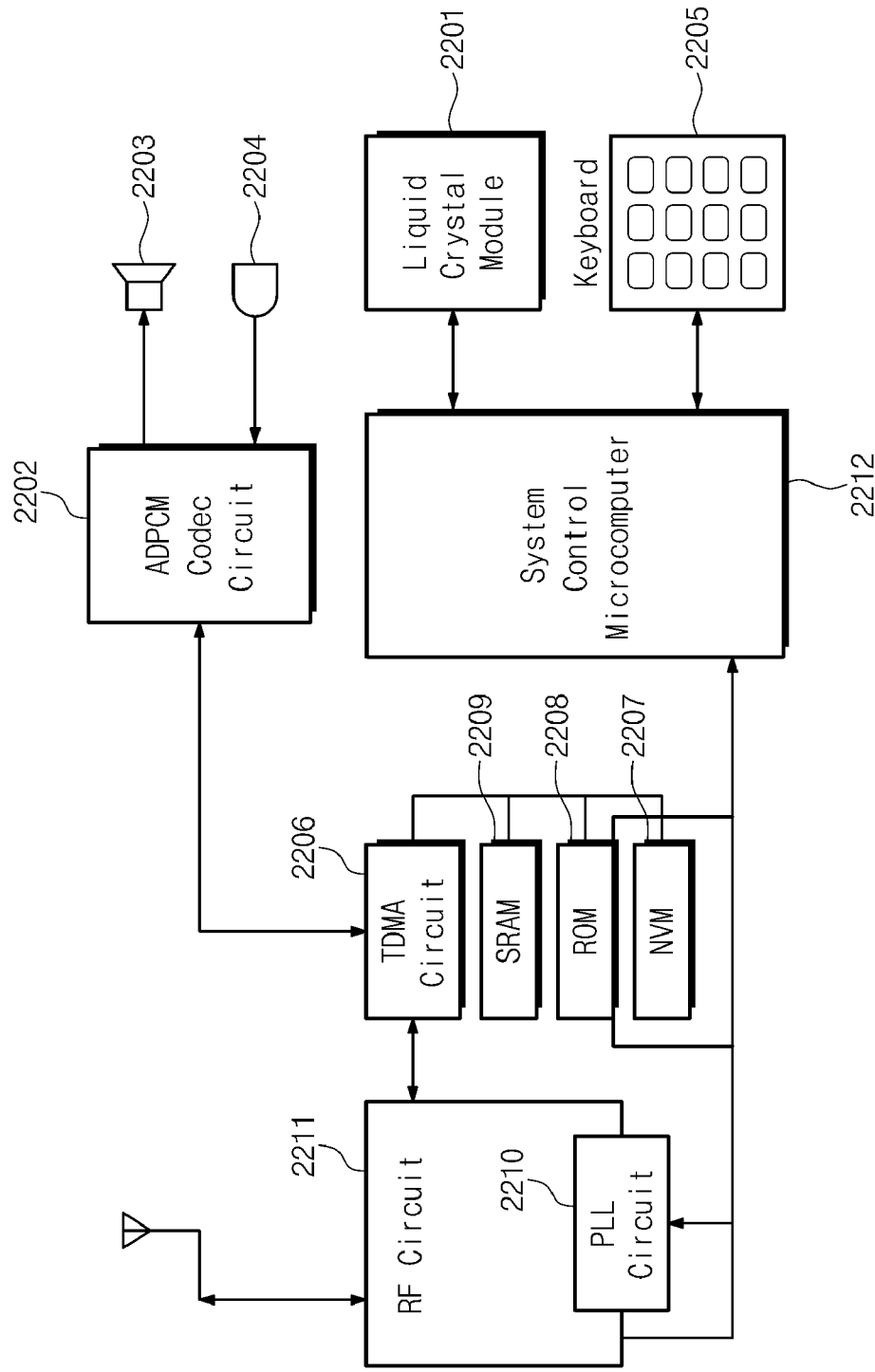
FIGS. 30 through 34 are diagrams illustrating various storage systems according to embodiments of the inventive concepts.

FIG. 30 is a diagram illustrating a cellular phone system that uses resistance-variable memory devices according to embodiments of the present inventive concepts.

Referring to FIG. 30, the cellular phone system may include an adaptive differential pulse code modulation (AD-PCM) codec circuit 2202 which compresses sound or decompresses compressed sound, a speaker 2203, a microphone 2204, a time division multiplex access (TDMA) circuit 2206 which time-division multiplexes digital data, a phase-locked loop (PLL) circuit 2210 which sets a carrier frequency of a wireless signal, and a radio frequency (RF) circuit 2211 which transmits or receives a wireless signal.

In addition, the cellular phone system may include various types of memory devices. For example, the cellular phone system may include a resistance-variable memory device 2207, a read only memory (ROM) 2208, and a static random access memory (SRAM) 2209. The resistance-variable memory device 2207 may correspond to the resistance-variable memory devices of one or more of the embodiments of the inventive concepts and may store, for example, an identification (ID) number. The ROM 2208 may store programs, and the SRAM 2209 may serve as a work area for a system control microcomputer 2212 or temporarily store data. The system control microcomputer 2212 is a processor and may control a write operation and a read operation of the resistance-variable memory device 2207.

Figure 31:
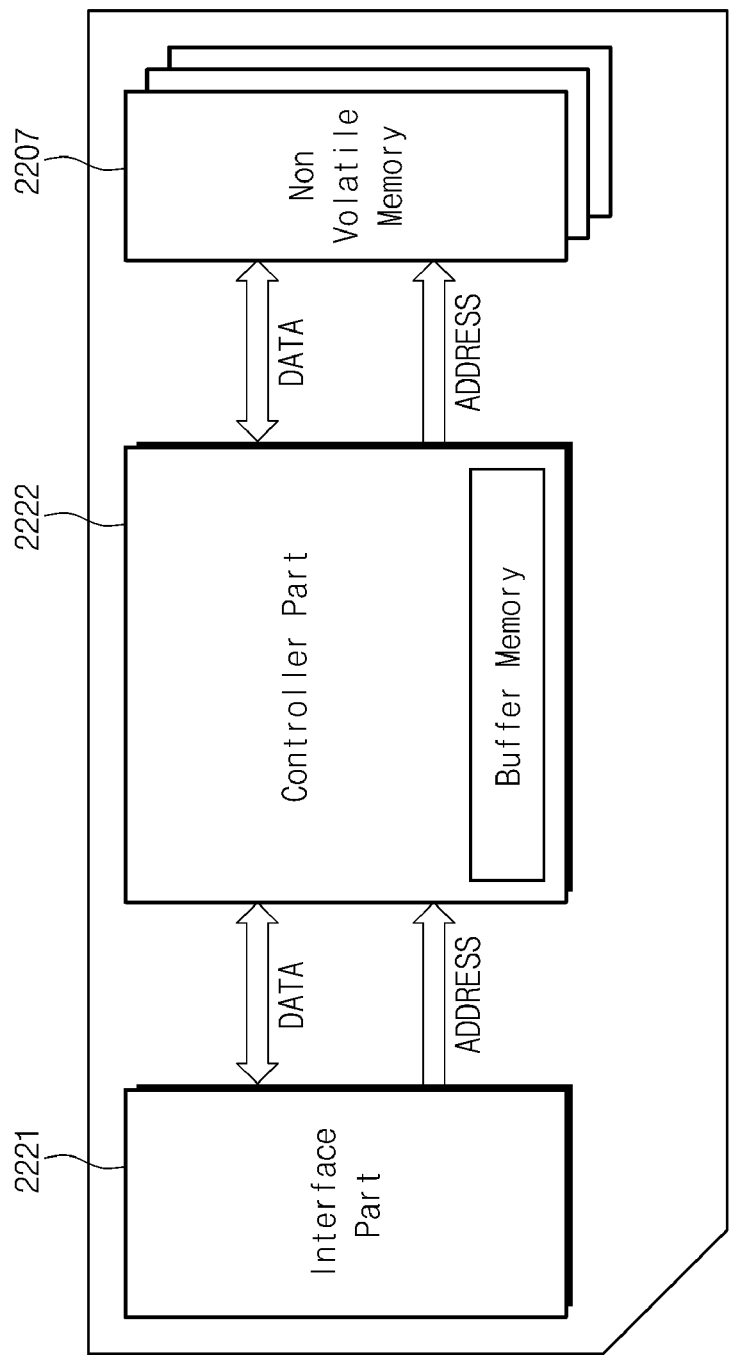

FIG. 31 is a diagram illustrating a memory card which uses resistance-variable memory devices according to one or more embodiments of the inventive concepts. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 31, the memory card may include an interface part 2221 which interfaces with an external device, a controller part 2222 which includes a buffer memory and controls the operation of the memory card, and one or more resistance-variable memories 2207 according to one or more embodiments of the inventive concepts. The controller part 2222 is a processor and may control the write and read operations of the resistance-variable memories 2207. Specifically, the controller part 2222 is coupled to each of the interface part 2221 and the resistance-variable memory devices 2207 by a data bus DATA and an address bus ADDRESS.

Figure 32:
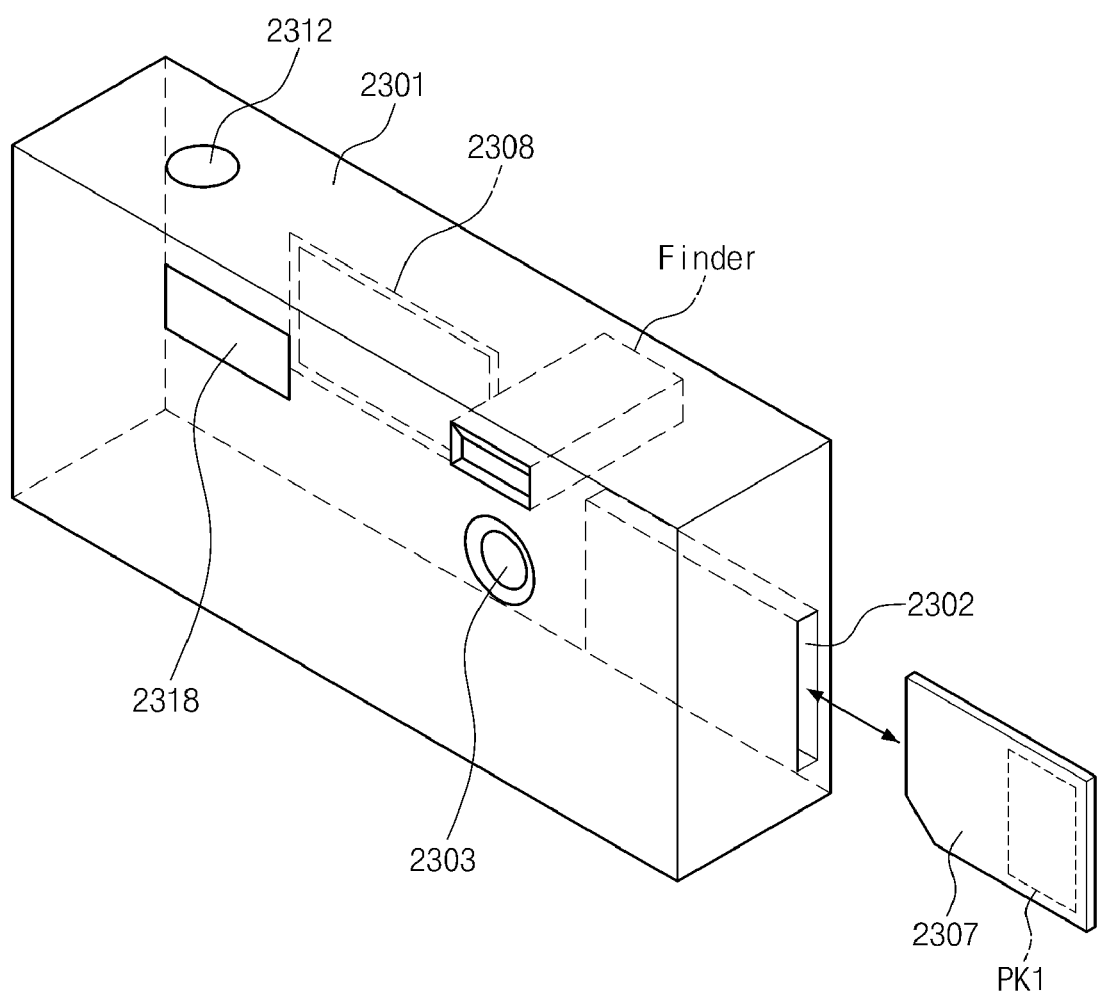

FIG. 32 is a diagram illustrating a digital still camera that uses resistance-variable memory devices according to one or more embodiments of the inventive concepts.

Referring to FIG. 32, the digital still camera includes a body 2301, a slot 2302, a lens 2303, a display 2308, a shutter button 2312, and a strobe 2318. In particular, a memory card 2307 may be inserted into the slot 2302 and include one or more resistance-variable memory devices PK1 according to one or more embodiments of the inventive concepts.

If the memory card 2307 is of a contact type, it electrically contacts a specified electrical circuit on a circuit board when it is inserted into the slot 2302. When the memory card 2331 is of a non-contact type, it communicates with the memory card 2307 using a wireless signal.

Figure 33:
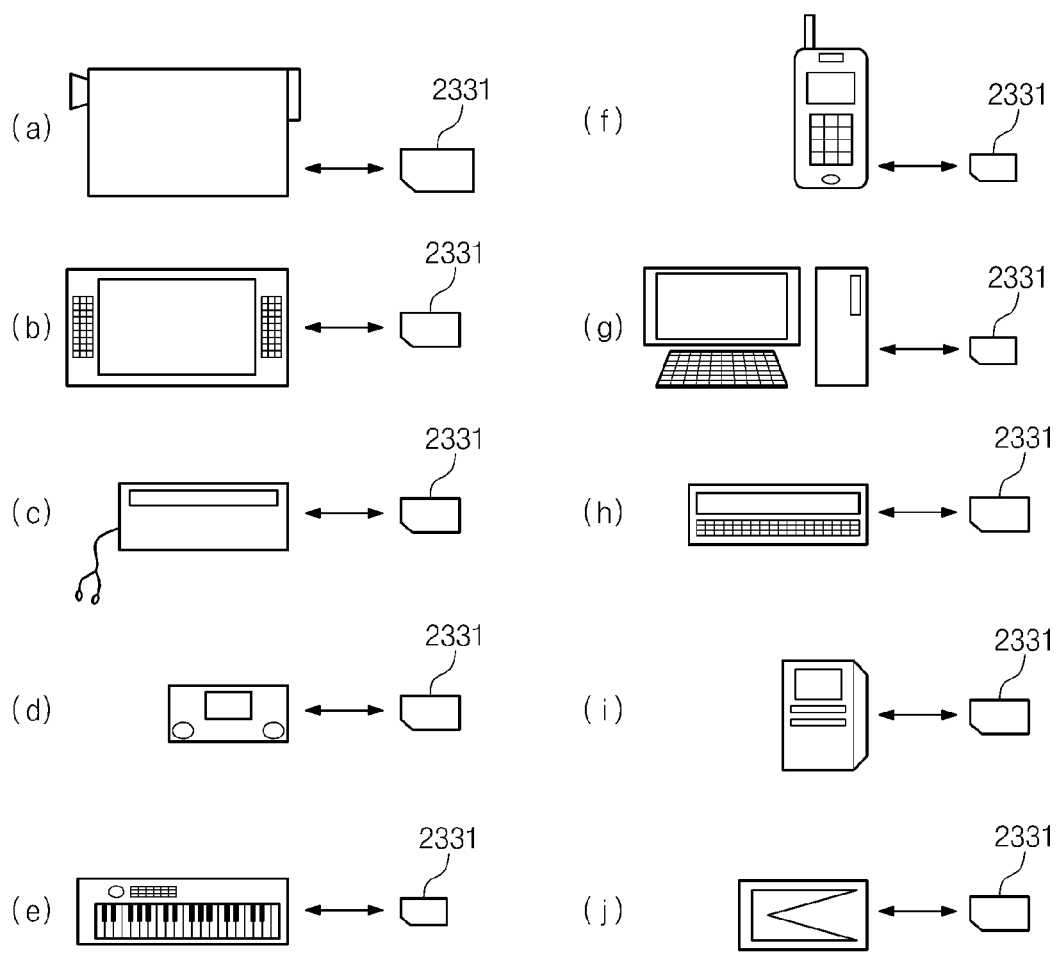

FIG. 33 is a diagram illustrating various systems that use the memory card of FIG. 31.

Referring to FIG. 33, a memory card 2331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 34:
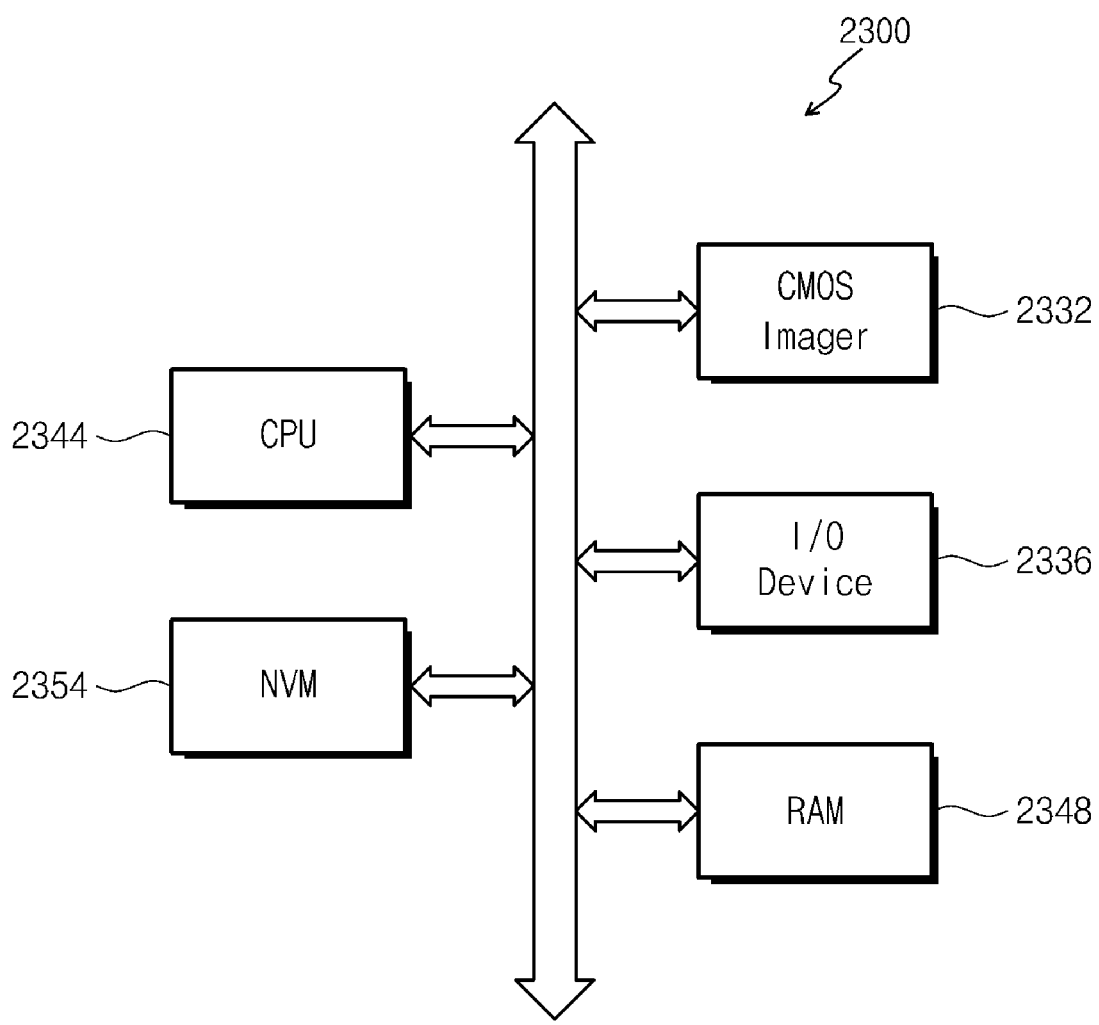

FIG. 34 is a diagram illustrating an image sensor system that uses resistance-variable memory devices according to one or more embodiments of the inventive concepts.

Referring to FIG. 34, the image sensor system may include an imager 2332, an input/output device 2336, a random access memory (RAM) 2348, a central processing unit (CPU) 2344, and a resistance-variable memory device 2354 according to one or more embodiments of the inventive concepts. These components, i.e., the imager 2332, the input/output device 2336, the RAM 2348, the CPU 2344, and the resistance-variable memory device 2354 communicate with each other using a bus 2352. The imager 2332 may include a photo sensing element such as a photogate or a photodiode. Each of the above components and a processor may be implemented as a single chip or separate chips.

Figure 35:
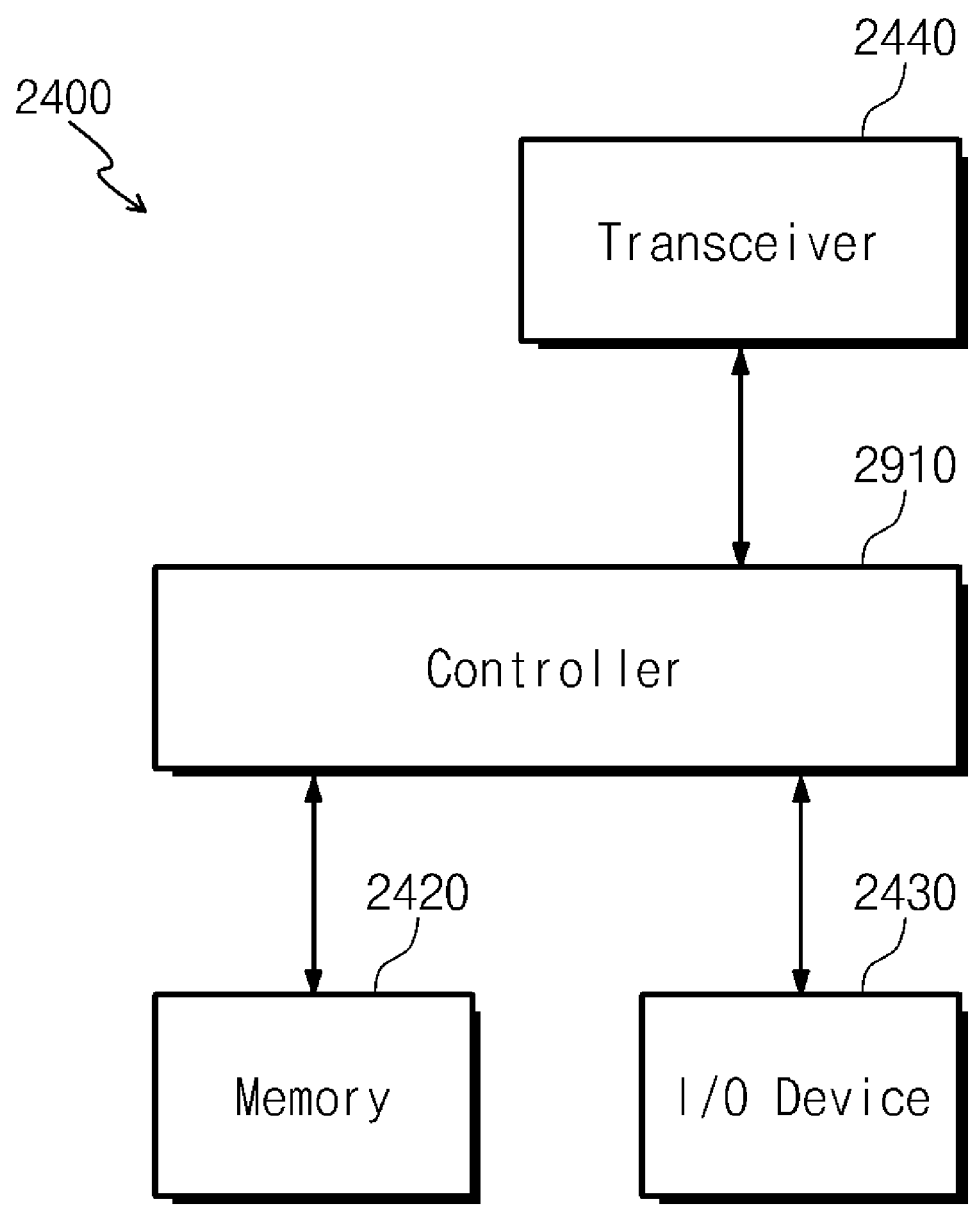
FIG. 35 is a schematic block diagram of a portable media system including a phase-change random access memory device according to embodiments of the inventive concepts.

FIG. 35 is a schematic block diagram of a portable media system including resistance-variable memory device according to one or more embodiments of the inventive concepts. The portable media system may, for example, be a mobile phone. However, the inventive concepts may also be applied to a two-way communications system, a one-way pager, a two-way pager, a personal communications system, a portable computer, a personal data assistance (PDA), an MPEG audio layer-3 (MP3) player, a digital camera, and other electronic devices.

Referring to FIG. 35, the portable media system 2400 includes a controller 2410, a memory unit 2420, an I/O device 2430, and a transceiver 2440.

The controller 2410 may, for example, include microprocessors, digital signal processors, microcontrollers, and the like.

The memory 2420 stores messages transmitted to the portable media system 400 or an external device. That is to say, the memory 2420 stores data or instructions executed by the controller while the portable media system 2400 is operating. The memory 2420 is composed of one or more different kinds of memories. For example, the memory 2420 may be a volatile memory device, or a resistance-variable memory device such as a flash memory device and/or a phase-change memory device. Here, usable examples of the phase-change memory device include PRAMs according to one or more embodiments of the inventive concepts.

In particular, the most challenging task of the portable media system 2400 is to minimize the amount of current consumed. As described in the foregoing embodiments of the present inventive concepts, the current and power consumption can be minimized by decreasing resistance of a column select transistor in a phase-change memory cell far away from a write and/or read circuit, thereby improving reliability during write and/or read operation.

The portable media system 2400 may transmit or receive messages in a wireless manner through the transceiver 2440 connected to an antenna (not shown). Here, the portable media system 2400 may transmit or receive messages using protocols such as CDMA (Code Division Multiple Access), GSM (Global System for Mobile communication), NADC (North 20 American Digital Cellular), TDMA (Time Division Multiple Access), ETDMA (Extended TDMA), third-generation WCDMA (Wideband CDMA), CDMA-2000, and so on.

The I/O device 2430 generates a message by user's manipulation. The I/O device 2430 may comprise a keypad, a monitor, and the like.

Figure 36:
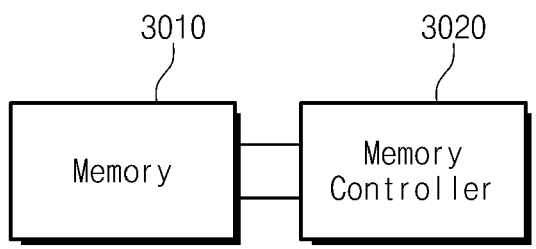
FIG. 36 through FIG. 43 illustrate various example embodiments of applications of the semiconductor device according to embodiments of the inventive concepts.

FIG. 36 illustrates another example embodiment of an application of the resistance-variable memory devices of the inventive concepts. As shown, this embodiment includes a memory 3010 connected to a memory controller 3020. The memory 3010 may be any of the resistance-variable memory devices of the inventive concepts described above. The memory controller 3020 supplies the input signals for controlling operation of the memory 3010. For example, the memory controller 3020 supplies the command CMD and address signals. The memory controller 3020 may include a memory interface, a host interface, an ECC circuit, a central processing unit (CPU), and a buffer memory. The memory interface provides data transmitted from the buffer memory to the memory 3010 or transmits data read out of the memory 3010 to the buffer memory. Also the memory interface may provide a command or an address transmitted from an external host to the memory 3010.

The host interface may communicate with an external host through USB (Universal Serial Bus), SCSI (Small Computer System Interface), PCI express, ATA, PATA (Parallel ATA), SATA (Serial ATA), SAS (Serial Attached SCSI).

A memory system according to embodiments of the present inventive concepts may include an ECC circuit, which generates a parity bit using data transmitted to a memory 3010. The generated parity bit may be stored in a specific area of the memory 3010, together with data. The ECC circuit detects an error of data read out of the memory 3010. If the detected error is within a correction range, the ECC circuit corrects the detected error.

The CPU processes a signal input from the external host after analyzing the input signal. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also the buffer memory may store meta data or cache data to stored in the memory 3010. During a sudden power-off operation, meta data or cache data stored in the buffer memory may be stored in the memory 3010. The buffer memory may include a DRAM and an SRAM.

Figure 37:
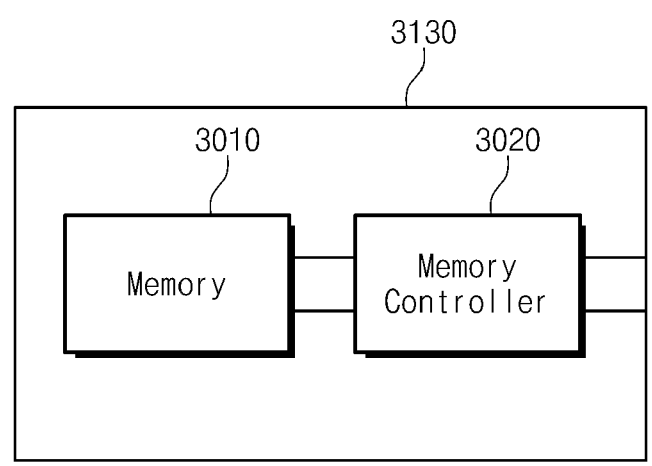

FIG. 37 illustrates yet another embodiment. This embodiment is the same as the embodiment of FIG. 36, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 38:
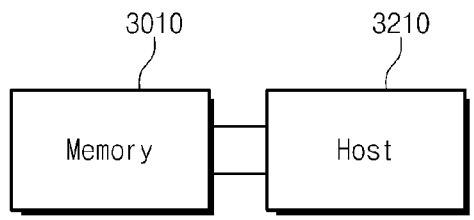

FIG. 38 illustrates a still further embodiment adopting the inventive concepts. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 39:
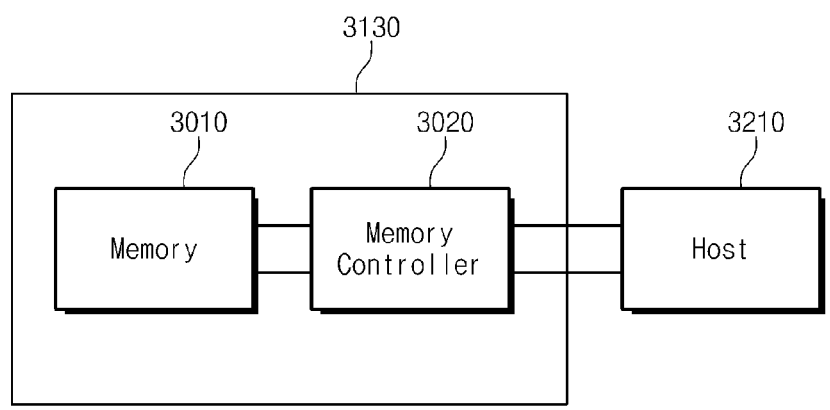

FIG. 39 illustrates an embodiment adopting the inventive concepts in which the host system 3210 is connected to the card 3130. In this embodiment, the host system 3210 applies control signals to the card 3130 such that the memory controller 3020 controls operation of the memory 3010.

Figure 40:
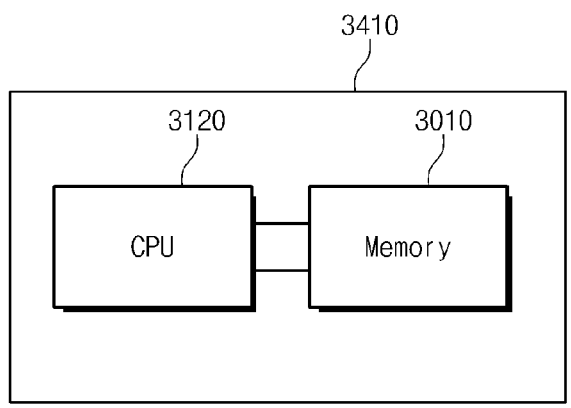

FIG. 40 illustrates a further embodiment adopting the inventive concepts. As shown, the memory 3010 may be connected to a central processing unit (CPU) 3420 within a computer system 3410. For example, the computer system 3410 may be a personal computer, personal data assistant, and so on. The memory 3010 may be directly connected with the CPU 3420, connected via a bus, for example. It will be appreciated that FIG. 40 does not illustrate the full complement of components that may be included within a computer system 3410 for the sake of brevity.

A semiconductor device according to some embodiments of the present inventive concepts may be used as a storage class memory (SCM), which is the general concept of memories capable of simultaneously providing nonvolatile characteristics and random access characteristics. The storage class memory may be utilized as not only a data storage region but also a program performing region. Also, the storage class memory may be utilized as not only a main memory but also a mass storage.

Also, the memory cell array of some embodiments of the inventive concepts may be data storage region.

The above-described PRAM, FeRAM, and MRAM may be appropriate examples of a storage class memory. Such a storage class memory may be used as not only a data storage memory instead of a flash memory, but also a main memory instead of an SDRAM. Moreover, one storage class memory may be used instead of a flash memory and an SDRAM.

Figure 41:
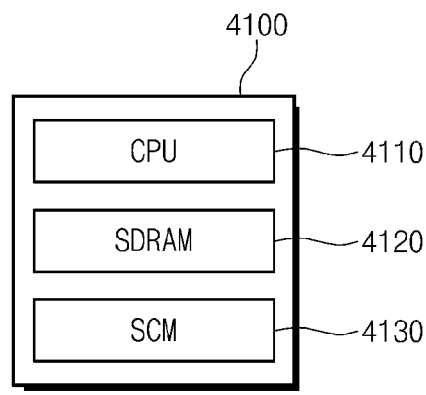

FIG. 41 illustrates an exemplary configuration of a memory system 4100 in which a storage class memory (SCM) is used instead of a flash memory. As illustrated, the memory system 4100 includes a CPU 4110, an SDRAM 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 42:
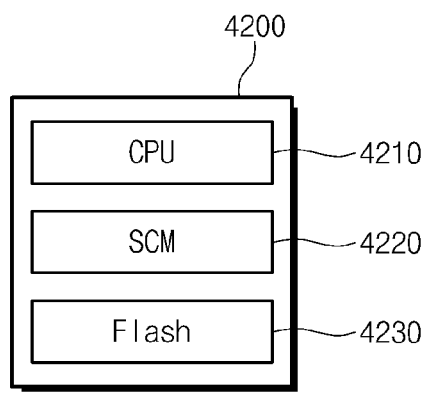

FIG. 42 illustrates an exemplary configuration of a memory system 4200 in which an SCM is used instead of an SDRAM. As illustrated, the memory system 4200 includes a CPU 4210, an SCM 4220, and a flash memory 4230. The SCM 4130 is used as a main memory instead of an SDRAM.

In the memory system 4200, power dissipation of the SCM 4220 is lower than that of an SDRAM. Energy dissipated by a main memory of a computer system amounts to about 40 percent of total energy. Therefore, many efforts have been intensively made to reduce power dissipation of a main memory. An SCM may reduce dynamic energy dissipation to an average of about 53 percent and reduce energy dissipation caused by power leakage to an average of about 73 percent. As a result, the memory system 4200 equipped with the SCM 4220 may allow power dissipation to be reduced more than a memory system equipped with an SDRAM.

Figure 43:
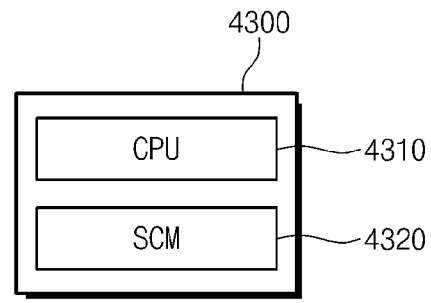

FIG. 43 illustrates an exemplary configuration of a memory system 4300 in which an SCM is substituted for an SDRAM as well as a flash memory. As illustrated, the memory system 4300 includes a CPU 4310 and an SCM 4320. The SCM 4320 is used as a main memory instated of an SDRAM and as a data storage memory instead of a flash memory. This memory system 4300 is advantageous in data access speed, low power, space utilization, and costs.

Figure 1:
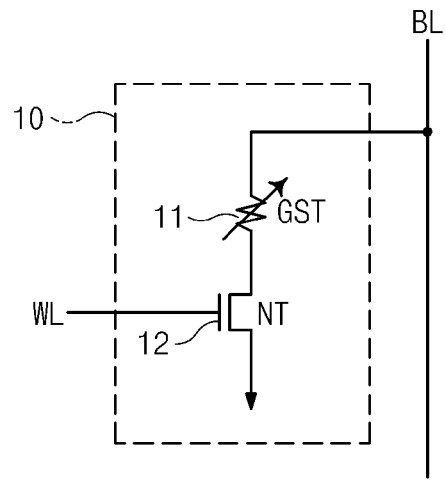
FIG. 1 is an equivalent circuit diagram showing a unit cell of a resistance-variable memory device.
Figure 2:
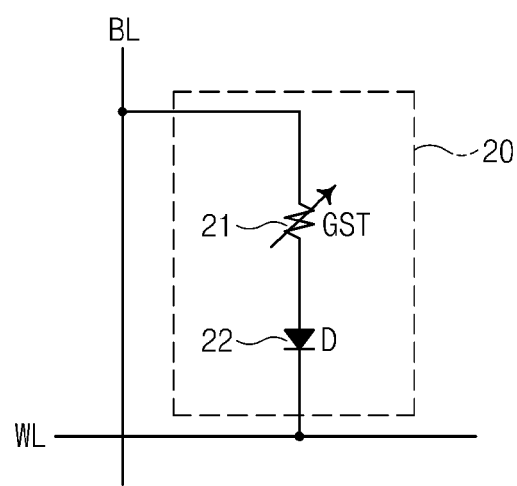
FIG. 2 is an equivalent circuit diagram showing a unit cell of another resistance-variable memory device.
Figure 3:
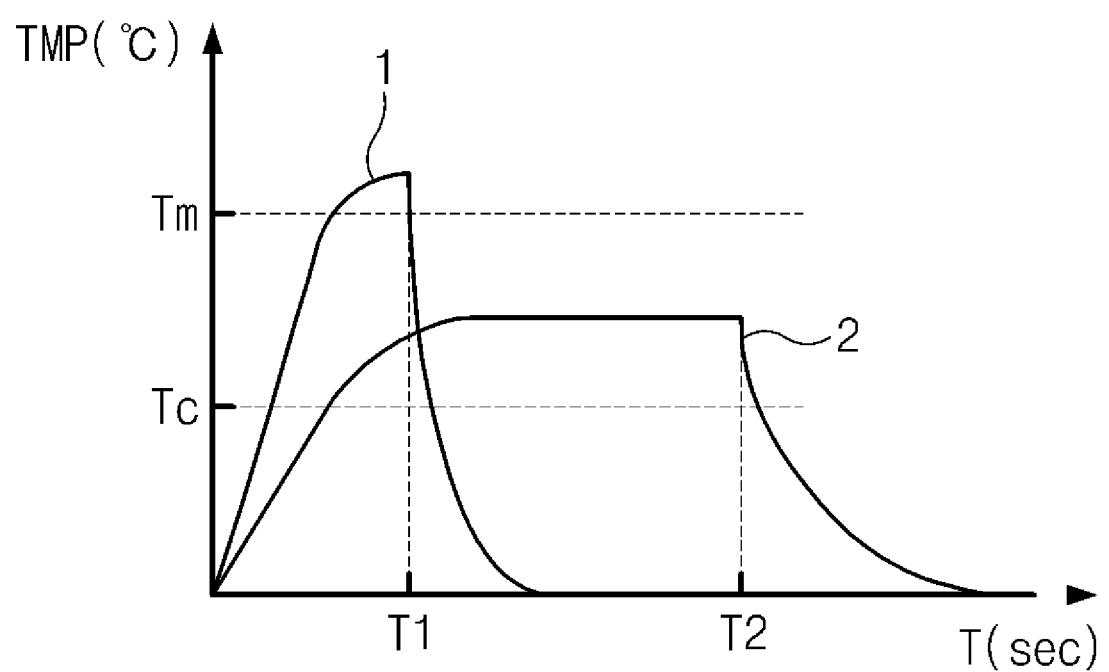
FIG. 3 is a graphic diagram showing programming characteristics of a resistance-variable material.

A resistance-variable memory device according to one or more embodiments of the inventive concepts can also be applied to a server SSD. U.S Patent Publication Nos. 2008/0256292, 2008/0256183, and 2008/0168304 disclose in FIG. 1A and the corresponding detailed description thereof that a solid-state storage 110 includes a PRAM, a flash, an MRAM, an NRAM, and a DRAM, and that a solid-state storage device 102 includes a solid-state storage controller 104 and a solid-state storage 110. In addition, U.S Patent Publication Nos. 2008/0256292, 2008/0256183, and 2008/0168304 disclose a solid-state memory and a controller, which process the speed of a high-speed interface, and a redundant array of independent drives (RAIDs) in a solid-state device, and are incorporated by reference herein in their entirety.

U.S. Pat. No. 6,242,605, U.S Patent Publication Nos. 2007/0236987 and 2008/0123389, and U.S patent application Ser. No. 12/461,036are also incorporated by reference herein.

The above-disclosed subject matter is to be considered illustrative, and not restrictive, and the appended claims are intended to cover all such modifications, enhancements, and other embodiments, which fall within the true spirit and scope of the present inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A resistance-variable memory device comprising:
   a memory cell connected to a first bitline;
   a reference cell connected to a second bitline;
   a high voltage circuit adapted to generate a high voltage from an externally provided power source voltage, wherein the high voltage is higher than the power source voltage;
   a precharging circuit adapted to charge the first bitline and the second bitline to the power source voltage, and to further charge the first bitline and the second bitline to the high voltage;
   a bias circuit adapted to provide a read current to the first bitline and the second bitline using the high voltage; and
   a sense amplifier adapted to detect a voltage level of the first bitline using the high voltage.

2. The resistance-variable memory device as set forth in claim 1, wherein the memory cell comprises:
   a memory element containing a resistance-variable material; and
   a selection element adapted to select the memory cell, wherein the selection element is a diode connected between the memory element and a wordline.

3. The resistance-variable memory device as set forth in claim 1, wherein the high voltage circuit comprises:
   a voltage pump adapted to boost the power source voltage; and
   a detector adapted to sense an output voltage level of the voltage pump and regulate the voltage pump.

4. The resistance-variable memory device as set forth in claim 1, wherein the precharging circuit comprises:
   a first precharging circuit adapted to charge the first bitline and the second bitline to the power source voltage; and
   a second precharging circuit adapted to charge the first bitline and the second bitline to the high voltage.

5. The resistance-variable memory device as set forth in claim 1, wherein the sense amplifier is adapted to compare a voltage of the first bitline with a reference voltage, and to output read data based on a comparison result.

6. The resistance-variable memory device as set forth in claim 1, further comprising:
   a clamping circuit connected between the first bitline and a sensing node and adapted to regulate a voltage of the first bitline,
   wherein the sensing node is connected to the precharging and bias circuits.

7. The resistance-variable memory device as set forth in claim 6, wherein the precharging circuit comprises:
   a first precharging circuit connected between a first power terminal and the sensing node, the first precharging circuit adapted to accept the power source voltage through the first power terminal and charge the sensing node to the power source voltage in response to a first precharging signal; and
   a second precharging circuit connected between a second power terminal and the sensing node, the second precharging circuit adapted to accept the high voltage through the second power terminal and charge the sensing node to the high voltage in response to a second precharging signal.

8. The resistance-variable memory device as set forth in claim 7, wherein the first precharging circuit is a PMOS transistor connected between the first power terminal and the sensing node, and is gated to respond to the first precharging signal,
   wherein the second precharging circuit is a PMOS transistor connected between the second power terminal and the sensing node, and is gated to respond to the second precharging signal.

9. The resistance-variable memory device as set forth in claim 1, wherein the memory cell is programmable into any one of at least two first resistive states, and wherein the reference cell is programmable into at least one second resistive state which is different than the at least two first resistive states.

10. A method of reading data in a resistance-variable memory device, the method comprising:
    discharging a first bitline that is connected to a memory cell;
    discharging a second bitline that is connected to a reference cell;
    charging the first bitline and the second bitline using an externally provided power source voltage;
    further charging the first bitline and the second bitline using a high voltage after charging the first bitline and the second bitline using the power source voltage, wherein the high voltage is higher than the power source voltage;
    providing a read current to the first bitline and the second bitline using the high voltage; and
    sensing a voltage of the first bitline using the high voltage and outputting read data from the memory cell based on the sensed voltage of the first bitline.

11. The method as set forth in claim 10, wherein the memory cell comprises:
    a memory element containing a resistance-variable material; and
    a selection element provided to select the memory cell, wherein the selection element is a diode connected between the memory element and a wordline.

12. The method as set forth in claim 10, wherein the memory cell is programmable into any one of at least two first resistive states, and wherein the reference cell is programmable into at least one second resistive state which is different than the at least two first resistive states.

13. A resistance-variable memory device comprising:
    a memory cell connected to a first bitline;
    a reference cell connected to a second bitline;
    a precharging circuit adapted to charge the first bitline and the second bitline to a precharging voltage;
    a bias circuit adapted to provide a read current to the first bitline and the second bitline using a high voltage which is higher than the precharging voltage;
    a sense amplifier adapted to detect a voltage level of the first bitline using the high voltage; and
    a high voltage circuit adapted to generate at least one of the precharging and high voltages from a power source voltage.

14. The resistance-variable memory device as set forth in claim 13, wherein the memory cell comprises:
   a memory element containing a resistance-variable material; and
   a selection element provided to select the memory cell,
   wherein the selection element is a diode connected between the memory element and a wordline.

15. The resistance-variable memory device as set forth in claim 13, wherein the precharging voltage is the power source voltage.

16. The resistance-variable memory device as set forth in claim 13, wherein the sense amplifier compares a voltage of the first bitline with a reference voltage, and output read data from the memory cell based on a comparison result.

17. The resistance-variable memory device as set forth in claim 16, wherein the precharging voltage is the reference voltage.

18. The resistance-variable memory device as set forth in claim 13, further comprising a clamping circuit which is connected between the first bitline and a sensing node and which is adapted to regulate a voltage of the first bitline,
   wherein the sensing node is connected with the precharging and bias circuits.

19. The resistance-variable memory device as set forth in claim 18, wherein the precharging circuit is connected between a power terminal and the sensing node, and is adapted to receive the precharging voltage through the power terminal and charge the sensing node to the precharging voltage during a precharging operation.

20. The resistance-variable memory device as set forth in claim 19, wherein the precharging circuit includes a PMOS transistor having a source connected to the power terminal, a drain connected to the sensing node, a gate to which a precharging signal is applied, and a bulk boosted by the high voltage.

* * * * *